(12) United States Patent
Wakita et al.

(10) Patent No.: US 9,493,614 B2
(45) Date of Patent: Nov. 15, 2016

(54) POLYIMIDE PRECURSOR, POLYIMIDE, FLEXIBLE SUBSTRATE PREPARED THEREWITH, COLOR FILTER AND PRODUCTION METHOD THEREOF, AND FLEXIBLE DISPLAY DEVICE

(71) Applicant: TORAY Industries, Inc., Tokyo (JP)

(72) Inventors: Junji Wakita, Otsu (JP); Yukari Jo, Otsu (JP); Masao Tomikawa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 106 days.

(21) Appl. No.: 14/387,823

(22) PCT Filed: Dec. 26, 2013

(86) PCT No.: PCT/JP2013/084857
§ 371 (c)(1),
(2) Date: Sep. 24, 2014

(87) PCT Pub. No.: WO2014/207963
PCT Pub. Date: Dec. 31, 2014

(65) Prior Publication Data
US 2016/0002407 A1 Jan. 7, 2016

(30) Foreign Application Priority Data

Feb. 26, 2013 (JP) .................... 2013-133546

(51) Int. Cl.
*C08G 73/10* (2006.01)
*G02B 5/28* (2006.01)
(Continued)

(52) U.S. Cl.
CPC ..... C08G 73/1007 (2013.01); B29D 11/00634 (2013.01); C08G 73/106 (2013.01);
(Continued)

(58) Field of Classification Search
CPC .......... C08G 73/1007; C08G 73/1053; C08G 73/1042; C08G 73/1082; C08G 73/1039; C08G 73/106; C09D 179/08; B29D 11/00634; B29K 2079/08; B29K 2995/002; B29K 2995/0026; G02B 5/287; G02B 5/223; G02B 5/20; H01L 51/52; H01L 51/0024; H01L 51/0097; H01L 27/3241
See application file for complete search history.

(56) References Cited

U.S. PATENT DOCUMENTS

2005/0054116 A1\* 3/2005 Potyrailo ............ B01J 19/0046
436/180
2008/0118730 A1\* 5/2008 Yu ................... B29C 55/023
428/220

FOREIGN PATENT DOCUMENTS

JO 2012-146905 A 8/2012
JP 2002-161136 A 6/2002
(Continued)

OTHER PUBLICATIONS

Park et al., "Solution-processed Metal Oxide TFTs and Circuits on a Plastic by Photochemical Activation Process", 23.2, pp. 271-274, SID 2013 Digest.
(Continued)

*Primary Examiner* — Rabon Sergent
(74) *Attorney, Agent, or Firm* — Birch, Stewart, Kolasch & Birch, LLP

(57) ABSTRACT

The present invention is based on a polyimide precursor having unit structures represented by general formula (1) and unit structures represented by general formula (2), provides a polyimide precursor for which film whitening, cracking and bubbling do not occur regardless of film baking conditions, and provides a flexible TFT array, a flexible color filter, and a flexible substrate with a gas barrier layer using the polyimide precursor, and a flexible display device, etc. using same. (In general formulas (1) and (2), $X^1$-$X^4$ each independently represents a hydrogen atom, C1 to C10 monovalent organic group or C1 to C10 monovalent alkylsilyl group. $R^1$ is represented by general formula (3) and $R^2$ is represented by general formula (4).) (In general formula (4), $R^3$ and $R^4$ each independently represents a C1 to C10 monovalent organic group.)

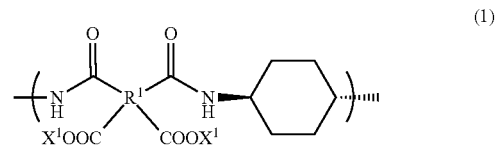

(1)

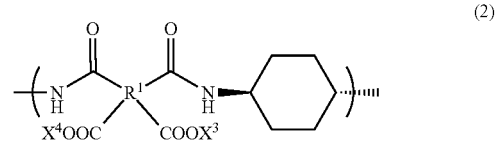

(2)

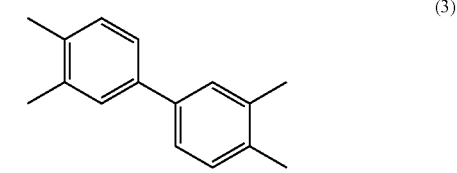

(3)

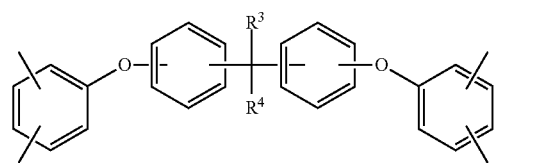

(4)

14 Claims, 5 Drawing Sheets

(51) Int. Cl.
- *H01L 51/00* (2006.01)
- *G02B 5/22* (2006.01)
- *H01L 51/52* (2006.01)
- *B29D 11/00* (2006.01)
- *C09D 179/08* (2006.01)
- *B29K 79/00* (2006.01)
- *H01L 27/32* (2006.01)

(52) U.S. Cl.
CPC ....... *C08G73/1039* (2013.01); *C08G 73/1042* (2013.01); *C08G 73/1053* (2013.01); *C08G 73/1064* (2013.01); *C08G 73/1067* (2013.01); *C08G 73/1071* (2013.01); *C08G 73/1082* (2013.01); *C09D 179/08* (2013.01); *G02B 5/223* (2013.01); *G02B 5/287* (2013.01); *H01L 51/0024* (2013.01); *H01L 51/52* (2013.01); *B29K 2079/08* (2013.01); *B29K 2995/002* (2013.01); *B29K 2995/0026* (2013.01); *H01L 27/3241* (2013.01); *H01L 51/0097* (2013.01)

(56) References Cited

FOREIGN PATENT DOCUMENTS

| | | |
|---|---|---|
| JP | 2003-176356 A | 6/2003 |
| JP | 2005-338394 A | 12/2005 |
| JP | 2008-045054 A | 2/2008 |
| JP | 2010-100674 A | 5/2010 |
| JP | 2012-041530 A | 3/2012 |
| JP | 2012-233021 A | 11/2012 |
| WO | WO 2005/050754 A1 | 6/2005 |
| WO | WO 2010/113412 A1 | 10/2010 |

OTHER PUBLICATIONS

Saito et al., "10.2-inch WUXGA Flexible AMOLED display Driven by Amorphous Oxide TFTs on Plastic Substrate", pp. 443-446, 70.1L, SID 2013 Digest.

Street, "Jet Printed TFTs and Circuits for Flexible Electronics", 23.1, pp. 267-270, SID 2013 Digest.

\* cited by examiner

POLYIMIDE PRECURSOR, POLYIMIDE, FLEXIBLE SUBSTRATE PREPARED THEREWITH, COLOR FILTER AND PRODUCTION METHOD THEREOF, AND FLEXIBLE DISPLAY DEVICE

TECHNICAL FIELD

The present invention relates to a polyimide precursor, a polyimide, a flexible substrate prepared therewith, a color filter and a production method thereof, and a flexible display device. More particularly, it relates to a polyimide precursor and the like suitably used for a flexible substrate which are applicable to a flat panel display, a touch panel, electronic paper, a color filter substrate, a solar cell and the like, and a flexible printed circuit board and the like.

BACKGROUND ART

As compared to glass, an organic film has the merits of being rich in flexibility, being difficult to break and being light in weight. Recently, by making a substrate for the flat panel display with an organic film, the investigation for allowing a display to become flexible has become more active.

In general, examples of a resin used for the organic film include polyester, polyamide, polyimide, polycarbonate, polyethersulfone, acryl, epoxy and the like. In particular, since polyimide has, in addition to higher heat resistance than that of other resins, both excellent mechanical properties such as high mechanical strength, abrasion resistance, dimensional stability and chemical resistance and excellent electrical properties such as insulation properties, a flat panel display substrate prepared with a polyimide film has been developed.

Examples of the flat panel display substrate include a TFT (Thin Film Transistor, thin-film transistor) substrate. Patent Literature 1 discloses a technique for preparing a TFT array and a display pixel on a polyimide film formed on a support substrate and peeling off them from the support substrate. Moreover, Non Patent Literature 1 discloses an organic EL display in which a transparent polyimide film is used as the substrate.

Other examples of the flat panel display substrate include a color filter substrate. The color filter is necessary for allowing an organic electroluminescence display and a liquid crystal display in which white light is used as the light source to perform color display. A typical three-color color filter has finely patterned three kinds of colored pixels of a red-colored colored pixel, a green-colored colored pixel and a blue-colored colored pixel. In the case of three-color color filter, white color is obtained by additive color mixing of three kinds of colored pixels of red, green and blue. In Patent Literatures 2 to 3, there has been disclosed a color filter in which a soluble transparent polyimide film is used as the substrate, and the use of a plastic substrate having features of being light in weight, being difficult to break and being bendable has been proposed.

With regard to the flat panel display substrate and the color filter substrate described above, firstly, being high in light transmittance in the visible light region is required. Secondly, in order to prevent the deterioration in alignment precision due to heating at the time of forming the display element and light-receiving element such as a TFT and a color filter, being low in coefficient of linear thermal expansion (CTE) is required. Thirdly, the chemical resistance to a solvent used at the time of preparing the display element and light-receiving element is required. Fourthly, the heat resistance in the formation process of a TFT and a gas barrier layer is required.

As a transparent polyimide exhibiting high light transmittance in the visible light region, there has been disclosed polyimide composed of a fluorine-containing and/or alicyclic acid dianhydride such as 2,2-bis(3,4-dicarboxyphenyl)hexafluoropropane dianhydride and 1,2,4,5-cyclohexanetetracarboxylic acid dianhydride and a fluorine-containing and/or alicyclic diamine such as 2,2'-bis(trifluoromethyl)benzidine and 4,4'-diaminodicyclohexylmethane (for example, see Patent Literatures 2 to 5). However, there is a problem that in the case where these polyimide resins are used to forma transparent substrate, a large CTE value of 50 ppm/°C. or more is exhibited, and since the chemical resistance to an organic solvent is low, swelling, dissolution or cracking occurs, and the like.

As a polyimide resin exhibiting being high in transparency, being low in CTE and being excellent in chemical resistance, there has been disclosed polyimide containing trans-1,4-cyclohexyldiamine as a diamine component (for example, see Patent Literatures 6 to 10). In these Literatures, for example, a polyimide obtained from 3,3',4,4'-biphenyl tetracarboxylic acid dianhydride and trans-1,4-cyclohexyldiamine, a copolymer of such a polyimide and a polyimide obtained from 2,2',3,3'-biphenyl tetracarboxylic acid dianhydride, 3,3',4,4'-oxydiphthalic dianhydride, diphenylsulfone-3,3',4,4'-tetracarboxylic acid dianhydride, benzophenone-3,3',4,4'-tetracarboxylic acid dianhydride and 2,2-bis(3,4-dicarboxyphenyl)hexafluoropropane dianhydride and the like and trans-1,4-cyclohexyldiamine, and the like have been disclosed.

CITATION LIST

Patent Literatures

[PTL 1]
WO 2005/050754 A
[PTL 2]
JP 2005-338394 A
[PTL 3]
JP 2012-146905 A
[PTL 4]
JP 2008-045054 A
[PTL 5]
JP 2010-100674 A
[PTL 6]
WO 2010/113412 A
[PTL 7]
JP 2003-176356 A
[PTL 8]
JP 2012-041530 A
[PTL 9]
JP 2002-161136 A
[PTL 10]
JP 2012-233021 A

Non-Patent Literature

[NPL 1]
SID '13Digest, pp 268-271 (2013)

SUMMARY OF INVENTION

Technical Problem

In an actual production process of a polyimide film, from the viewpoints of utilization of existing facilities and enhancement in productivity by shortening the curing time, it is preferred that the cure of a polyimide precursor resin film be performed on a hot plate or in an oven previously heated to a high temperature. However, in a conventional polyimide in which 3,3',4,4'-biphenyl tetracarboxylic acid dianhydride and trans-1,4-cyclohexyldiamine are used as parts of the raw materials, it has been found that white turbidity, cracking and foaming are generated in the film under the curing condition described above.

In view of the above-mentioned problems, the present invention is aimed at providing a polyimide precursor which does not cause white turbidity, cracking and foaming of a film irrespective of the curing condition of the film. Furthermore, the present invention is aimed at providing a flexible TFT array, a flexible color filter and a flexible substrate with a gas barrier layer, which are prepared with the transparent polyimide resin film of the present invention, and a flexible display panel prepared therewith.

Solution to Problem

The present inventors conducted studies on the above-mentioned problems and speculated that white turbidity of a film was generated due to the crystallization of the polyimide and the phase separation of the copolymer. On the other hand, the present inventors speculated that cracking and foaming were generated due to low affinity between a polyimide precursor and solvent molecules. And then, by making efforts to solve the problems from the viewpoints described above, the present inventors have reached the configuration of the present invention.

That is, the present invention is directed to a polyimide precursor having a unit structure expressed by a general formula (1) and a unit structure expressed by a general formula (2).

[Chem. 1]

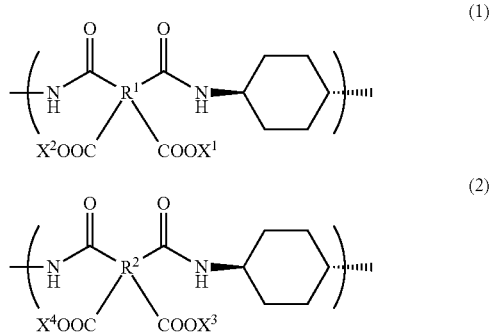

(In the general formulas (1) and (2), $X^1$ to $X^4$ each independently represent a hydrogen atom, a monovalent organic group with 1 to 10 carbon atoms or a monovalent alkylsilyl group with 1 to 10 carbon atoms. $R^1$ is represented by a general formula (3) and $R^2$ is represented by a general formula (4).)

[Chem. 2]

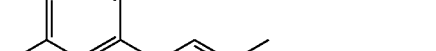

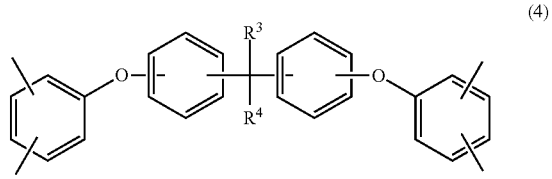

(In the general formula (4), $R^3$ and $R^4$ each independently represent a monovalent organic group with 1 to 10 carbon atoms.)

Advantageous Effects of Invention

According to the present invention, there is provided a polyimide precursor which does not cause white turbidity, cracking and foaming of a film irrespective of the curing condition in the production process of the polyimide resin film.

DESCRIPTION OF EMBODIMENTS

Figure 1A:
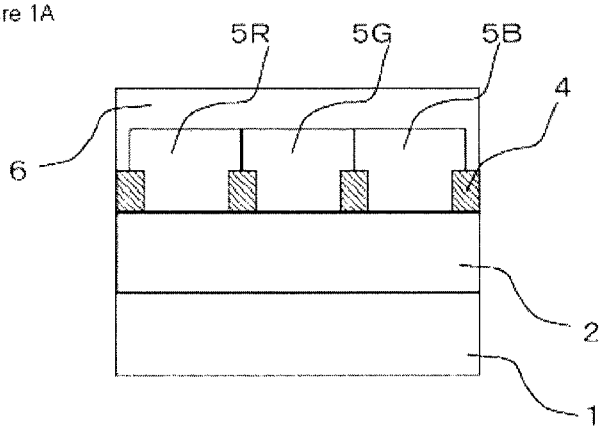
FIG. 1A is a cross-sectional view showing an example of a flexible CF.

Hereinafter, the embodiment according to the present invention will be described in detail. In this connection, the present invention should not be limited to the following embodiment and can be implemented in other various ways within the gist thereof.

<Polyimide Precursor>

The present invention is directed to a polyimide precursor having a unit structure expressed by a general formula (1) and a unit structure expressed by a general formula (2).

[Chem. 3]

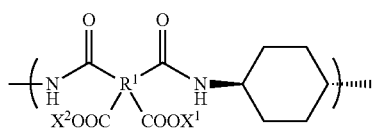
(1)

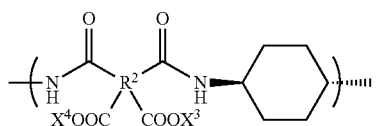
(2)

In the general formulas (1) and (2), $X^1$ to $X^4$ each independently represent a hydrogen atom, a monovalent organic group with 1 to 10 carbon atoms or a monovalent alkylsilyl group with 1 to 10 carbon atoms. $R^1$ is represented by a general formula (3) and $R^2$ is represented by a general formula (4).

[Chem. 4]

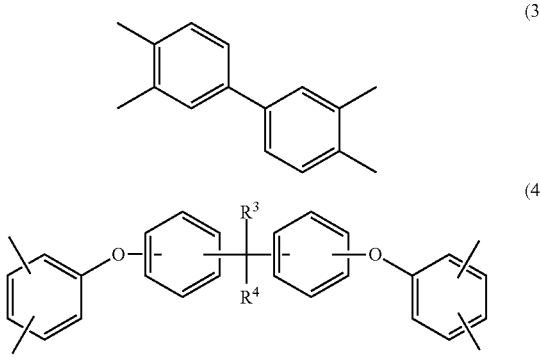

(3)

(4)

In the general formula (4), $R^3$ and $R^4$ each independently represent a monovalent organic group with 1 to 10 carbon atoms.

In the case where $X^1$ to $X^4$ in the general formulas (1) and (2) represent a monovalent organic group with 1 to 10 carbon atoms, examples thereof include a saturated hydrocarbon group, an unsaturated hydrocarbon group, an aromatic group and the like. Examples of the saturated hydrocarbon group include an alkyl group such as a methyl group, an ethyl group and a tert-butyl group. The saturated hydrocarbon group may be further substituted with a halogen atom. Examples of the unsaturated hydrocarbon group include a vinyl group, an ethynyl group, a biphenyl group, a phenylethynyl group and the like. The unsaturated hydrocarbon group may be further substituted with a halogen atom. Examples of the aromatic group include a phenyl group and the like. The aromatic group may be further substituted with a saturated hydrocarbon group, an unsaturated hydrocarbon group or a halogen atom. Examples of the monovalent alkylsilyl group with 1 to 10 carbon atoms include a trimethylsilyl group and the like.

$R^1$ in the general formula (1) is represented by the general formula (3) and has a structure derived from 3,3',4,4'-biphenyl tetracarboxylic acid dianhydride. Each of two connecting positions (amide groups) which form the main chain is arranged at each of two benzene rings. Although examples of the structure include a structure in which an amide group is arranged at the para position in one benzene ring and an amide group is arranged at the meta position in another benzene ring, like a unit structure represented by the following general formula (1') the structure is not limited thereto.

[Chem. 5]

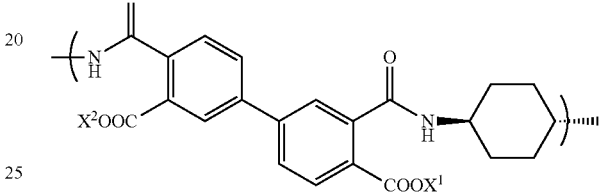
(1')

$R^2$ in the general formula (2) is represented by the general formula (4). $R^3$ and $R^4$ in the general formula (4) are not particularly limited as long as they represent a monovalent organic group with 1 to 10 carbon atoms, and although the binding sites of each benzene ring included in the general formula (4) are also not particularly limited, each of two connecting positions (amide groups) which form the main chain is arranged at each of two benzene rings at both ends. Examples of the organic group include a saturated hydrocarbon group, an unsaturated hydrocarbon group, an alkoxy group, an aromatic group and the like. Examples of the saturated hydrocarbon group include an alkyl group such as a methyl group, an ethyl group and a tert-butyl group. The saturated hydrocarbon group may be further substituted with a halogen atom. Examples of the unsaturated hydrocarbon group include a vinyl group, an ethynyl group, a biphenyl group, a phenylethynyl group and the like. The unsaturated hydrocarbon group may be further substituted with a halogen atom. Examples of the aromatic group include a phenyl group and the like. The aromatic group may be further substituted with a saturated hydrocarbon group, an unsaturated hydrocarbon group or a halogen atom.

Specific examples of the structure represented by the general formula (4) include a structure derived from the following group, namely, a structure obtained by removing a carboxyl group from the following group, and the like. Examples of the group include a 2,2-bis(4-(3,4-dicarboxyphenoxyl)phenyl)propyl group, a 2,2-bis(3-(3,4-dicarboxyphenoxyl)phenyl)propyl group, a 2,2-bis(4-(3,4-dicarboxyphenoxyl)phenyl)hexafluoropropyl group, a 2,2-bis(3-(3,4-dicarboxyphenoxyl)phenyl)hexafluoropropyl group and the like. Of these, from the viewpoints of being commercially available and easy availability, a structure expressed by a general formula (4') is preferred. This is a structure derived from a 2,2-bis(4-(3,4-dicarboxyphenoxyl)phenyl)propyl group.

[Chem. 6]

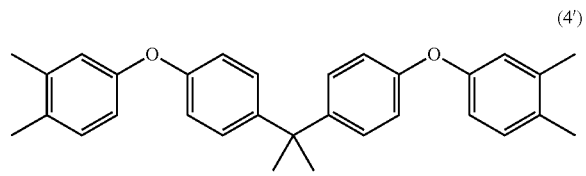

(4')

Although the details of the mechanism which suppresses white turbidity, cracking and foaming of a film irrespective of the curing condition of the film in the case where the polyimide precursor according to the present invention is used have not yet been elucidated, the reason therefor is presumed to be as follows.

1) Inhibition of Crystallization

The unit structure of a polyimide obtained from a unit structure expressed by the general formula (1) is expressed by a general formula (5). Since a polyimide composed of the unit structure is high in linearity of its molecular chain and high in stiffness, it is considered that crystallization causing white turbidity easily occurs at the time of curing. On the other hand, the unit structure of a polyimide obtained from a unit structure expressed by the general formula (2) is expressed by a general formula (6). Since the unit structure has a bisphenol structure which forms a bulky stereostructure, with regard to a polyimide having both of a unit structure expressed by the general formula (5) and a unit structure expressed by the general formula (6), it is considered that crystallization causing white turbidity is suppressed.

[Chem. 7]

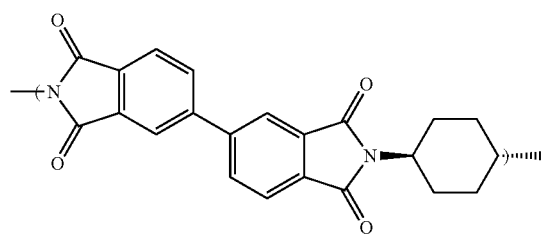

(5)

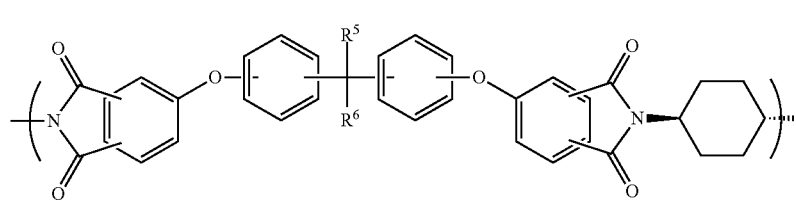

(6)

In the general formula (6), $R^5$ and $R^6$ each independently represent a monovalent organic group with 1 to 10 carbon atoms. $R^5$ and $R^6$ in the general formula (6) are not particularly limited as long as they represent a monovalent organic group with 1 to 10 carbon atoms, and the binding sites of each benzene ring included in the general formula (6) are also not particularly limited. Examples of the organic group include a saturated hydrocarbon group, an unsaturated hydrocarbon group, an alkoxy group, an aromatic group and the like. Examples of the saturated hydrocarbon group include an alkyl group such as a methyl group, an ethyl group and a tert-butyl group. The saturated hydrocarbon group may be further substituted with a halogen atom. Examples of the unsaturated hydrocarbon group include a vinyl group, an ethynyl group, a biphenyl group, a phenylethynyl group and the like. The unsaturated hydrocarbon group may be further substituted with a halogen atom. Examples of the aromatic group include a phenyl group and the like. The aromatic group may be further substituted with a saturated hydrocarbon group, an unsaturated hydrocarbon group or a halogen atom.

2) Suppression of Phase Separation

Patent Literature 8 discloses a polyimide copolymer having a unit structure expressed by the general formula (5) and a unit structure expressed by a general formula (7). In this copolymer, in the case where the rate of temperature increase on curing a film is high, it has been found that the white turbidity of the film is more significant than that in the case of a polyimide composed only of the unit structure expressed by the general formula (5). It is considered that the white turbidity in this case is due to the phase separation between the two unit structures. On the other hand, since the unit structure expressed by the general formula (5) and the unit structure expressed by the general formula (6) are high in affinity therebetween, it is presumed that phase separation causing white turbidity hardly occurs.

[Chem. 8]

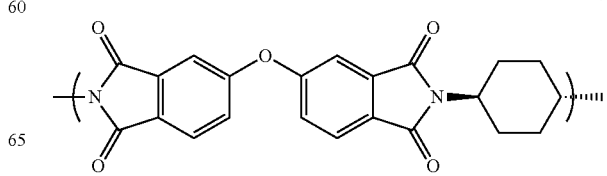

(7)

3) Affinity with Solvent

Patent Literature 8 discloses a polyimide copolymer having a unit structure expressed by the general formula (5) and a unit structure expressed by a general formula (8). In this copolymer, it has been found that cracking is generated in a precursor film when a film obtained by coating a solution containing the polyimide precursor was prebaked. The solvent remaining in the precursor film has an effect of acting as a plasticizer for a film and preventing cracking due to thermal stress generated on prebaking. However, since the interaction between solvent molecules and the molecular chain of a polyimide precursor is lowered by the influence of fluorine atoms contained in the unit structure expressed by the general formula (8), it is considered that the solvent becomes easy to evaporate from the precursor film on prebaking. Therefore, it is considered that the function as a plasticizer of the residual solvent in the precursor film is lowered and cracking becomes easy to be generated by thermal stress.

Moreover, in the case where prebaking is performed more mildly than normal so much that cracking is not generated, it has been found that the film foams in a subsequent temperature-increasing process. It is considered that this foaming is attributed to rapid evaporation of the residual solvent in the film during heating. On the other hand, since a polyimide having a unit structure expressed by the general formula (5) and a unit structure expressed by the general formula (6) does not contain fluorine atoms, it is presumed that the affinity between the molecular chain of a polyimide precursor and solvent molecules is not lowered and cracking and foaming are not generated.

[Chem. 9]

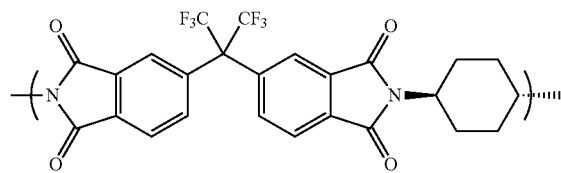

(8)

Although a ratio of the unit structure expressed by a general formula (1) to the unit structure expressed by a general formula (2) [the number of moles of the unit structure expressed by a general formula (1)/the number of moles of the unit structure expressed by a general formula (2)] is not particularly limited, it is preferred that the ratio be 70/30 to 99.5/0.5.

Moreover, from the viewpoints of being low in CTE and heat resistance in a manufacturing process at high temperatures exemplified by a forming process of a gas barrier layer, the ratio is preferably 70/30 or more, more preferably 80/20 or more, and further preferably 90/10 or more. Being 70/30 or more refers to the mole fraction of the unit structure expressed by a general formula (1) of 70% by mole or more. When the ratio lies within the above-mentioned range, a polyimide film which is lower in CTE and high in heat resistance can be obtained. Therefore, even when a polyimide film is heated at high temperatures on a process of forming a gas barrier film on the polyimide film prepared with the polyimide precursor and the like, the deformation such as wrinkles in the polyimide film does not occur. Accordingly, a gas barrier layer can be formed at a high film-forming temperature which is advantageous for the formation of a gas barrier layer with low gas permeability. The ratio of the unit structures of a polymer can be determined by the mass spectrometry, pyrolysis gas chromatography (GC), NMR and IR measurement of a polyimide precursor and a polyimide.

The polyimide precursor according to the present invention may contain another unit structure as long as the precursor is composed mainly of the unit structures expressed by the general formulas (1) and (2). In this context, being composed mainly refers to the proportion of the total of the unit structures expressed by the general formulas (1) and (2) to all the unit structures in a polyimide precursor being larger than that of other unit structures. Examples of other unit structures include a unit structure obtained by reaction with an acid dianhydride other than the acid dianhydride used for the synthesis of unit structures expressed by the general formulas (1) and (2) (this is referred to as "another acid dianhydride") and a diamine compound, and a unit structure obtained by reaction with a diamine other than trans-1,4-cyclohexyldiamine (this is referred to as "another diamine") and an acid dianhydride.

Examples of another acid dianhydride include an aromatic acid dianhydride, an alicyclic acid dianhydride and an aliphatic acid dianhydride.

Although examples of the aromatic acid dianhydride include pyromellitic acid dianhydride, 2,3,3',4'-biphenyltetracarboxylic acid dianhydride, 2,2',3,3'-biphenyltetracarboxylic acid dianhydride, 3,3',4,4'-terphenyltetracarboxylic acid dianhydride, 2,3,3',4'-oxyphthalic acid dianhydride, 2,3,2',3'-oxydiphthalic acid dianhydride, diphenylsulfone-3,3',4,4'-tetracarboxylic acid dianhydride, benzophenone-3,3',4,4'-tetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)ether dianhydride, bis(1,3-dioxo-1,3-dihydroisobenzofuran-5-carboxylic acid)1,4-phenylene-2,2-bis(4-(4-aminophenoxyl)phenyl)propane, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 3,4,9,10-perylenetetracarboxylic acid dianhydride, 4,4'-(hexafluoroisopropylidene)diphthalic acid anhydride, 2,2-bis(4-(3,4-dicarboxybenzoyloxyl)phenyl) hexafluoropropane dianhydride, 1,6-difluoropyromellitic acid dianhydride, 1-trifluoromethylpyromellitic acid dianhydride, 1,6-ditrifluoromethylpyromellitic acid dianhydride, 2,2'-bis(trifluoromethyl)-4,4'-bis(3,4-dicarboxyphenoxy)biphenyl dianhydride and the like, the aromatic acid dianhydride is not limited thereto.

Although the alicyclic acid dianhydride is exemplified by 1,2,3,4-cyclobutanetetracarboxylic acid dianhydride, 1,2,3,4-cyclopentanetetracarboxylic acid dianhydride, 1,2,4,5-cyclohexanetetracarboxylic acid dianhydride, 1,2,3,4-tetramethyl-1,2,3,4-cyclobutanetetracarboxylic acid dianhydride, 1,2-dimethyl-1,2,3,4-cyclobutanetetracarboxylic acid dianhydride, 1,3-dimethyl-1,2,3,4-cyclobutanetetracarboxylic acid dianhydride, 1,2,3,4-cycloheptanetetracarboxylic acid dianhydride, 2,3,4,5-tetrahydrofurantetracarboxylic acid dianhydride, 3,4-dicarboxy-1-cyclohexylsuccinic acid dianhydride, 2,3,5-tricarboxycyclopentylacetic acid dianhydride, 3,4-dicarboxy-1,2,3,4-tetrahydro-1-naphthalene succinic acid dianhydride, bicyclo[3,3,0]octane-2,4,6,8-tetracarboxylic acid dianhydride, bicyclo[4,3,0]nonane-2,4, 7,9-tetracarboxylic acid dianhydride, bicyclo[4,4,0]decane-2,4,7,9-tetracarboxylic acid dianhydride, bicyclo[4,4,0]decane-2,4,8,10-tetracarboxylic acid dianhydride, tricyclo[6,3,0,0<2,6>]undecane-3,5,9,11-tetracarboxylic acid dianhydride, bicyclo[2,2,2]octane-2,3,5,6-tetracarboxylic acid dianhydride, bicyclo[2,2,2]oct-7-ene-2,3,5,6-tetracarboxylic acid dianhydride, bicyclo[2,2,1]heptanetetracarboxylic acid dianhydride, bicyclo[2,2,1]heptane-5-carboxymethyl-2,3,6-tricarboxylic acid dianhydride, 7-oxabicyclo[2,2,1]heptane-2,4,6,8-tetracarboxylic acid dianhydride, octahydronaphthalene-1,2,6,7-tetracarboxylic acid dianhydride, tetradecahydroanthracene-1,2,8,9-tetracarboxylic acid dianhydride, 3,3',4,4'-dicyclohexanetetracarboxylic acid dianhydride, 3,3',4,4'-oxydicyclohexanetetracarboxylic acid dianhydride, 5-(2,5-dioxotetrahydro-3-furanyl)-3-methyl-3-cyclohexene-1, 2-dicarboxylic anhydride, and "RIKACID" (registered trademark) BT-100 (hereinabove, trade name, available from New Japan Chemical Co., Ltd.) and a derivative thereof and the like, the alicyclic acid dianhydride is not limited thereto.

Although examples of the aliphatic acid dianhydride include 1,2,3,4-butanetetracarboxylic acid dianhydride, 1,2,3,4-pentanetetracarboxylic acid dianhydride, a derivative thereof and the like, the aliphatic acid dianhydride is not limited thereto.

These aromatic acid dianhydrides, alicyclic acid dianhydrides and aliphatic acid dianhydrides can be used alone or in combination of two or more thereof.

Of these, from the viewpoints of commercial availability and easy availability, and the viewpoint of enhancement in transparency of a polyimide resin film, 4,4'-(hexafluoroisopropylidene)diphthalic acid anhydride is preferred. In particular, it is preferred that a unit structure expressed by the following general formula (9), which is a unit structure obtained by reaction with this acid dianhydride and trans-1,4-cyclohexyldiamine, be contained in a polyimide precursor.

[Chem. 10]

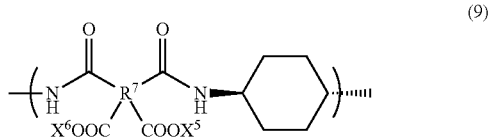

(9)

In the general formula (9), $X^5$ and $X^6$ each independently represent a hydrogen atom, a monovalent organic group with 1 to 10 carbon atoms or a monovalent alkylsilyl group with 1 to 10 carbon atoms. $R^7$ is represented by a general formula (10).

[Chem. 11]

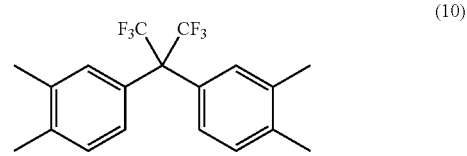

(10)

Examples of the monovalent organic group with 1 to 10 carbon atoms include a saturated hydrocarbon group, an unsaturated hydrocarbon group, an aromatic group and the like. Examples of the saturated hydrocarbon group include an alkyl group such as a methyl group, an ethyl group and a tert-butyl group. The saturated hydrocarbon group may be further substituted with a halogen atom. Examples of the unsaturated hydrocarbon group include a vinyl group, an ethynyl group, a biphenyl group, a phenylethynyl group and the like. The unsaturated hydrocarbon group may be further substituted with a halogen atom. Examples of the aromatic group include a phenyl group and the like. The aromatic group may be further substituted with a saturated hydrocarbon group, an unsaturated hydrocarbon group or a halogen atom. Examples of the monovalent alkylsilyl group with 1 to 10 carbon atoms include a trimethylsilyl group and the like.

A ratio of the unit structure expressed by a general formula (2) to the unit structure expressed by a general formula (9) [the number of moles of the unit structure expressed by a general formula (2)/the number of moles of the unit structure expressed by a general formula (9)] is not particularly limited as long as the polyimide precursor is composed mainly of the unit structures expressed by the general formulas (1) and (2), and it is preferred that the ratio lie within the range of 0.5/99.5 to 99.5/0.5. A more preferred range is 80/20 or more and 20/80 or less. The ratio of the unit structures of a polymer can be determined by the mass spectrometry, pyrolysis gas chromatography (GC), NMR and IR measurement of a polyimide precursor and a polyimide.

Even when a unit structure expressed by the general formula (9) is further contained in a polyimide precursor having a unit structure expressed by the general formula (1) and a unit structure expressed by the general formula (2), cracking and foaming are not generated in a film prepared therefrom.

Examples of another diamine compound include an aromatic diamine compound, an alicyclic diamine compound and an aliphatic diamine compound. Although examples of the aromatic diamine compound include 3,4'-diaminodiphenyl ether, 4,4'-diaminodiphenyl ether, 3,4'-diaminodiphenyl methane, 4,4'-diaminodiphenyl methane, 3,3'-diaminodiphenyl sulfone, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy)benzene, benzidine, 2,2'-bis(trifluoromethyl)benzidine, 3,3'-bis(trifluoromethyl)benzidine, 2,2'-dimethylbenzidine, 3,3'-dimethylbenzidine, 2,2',3,3'-tetramethylbenzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxyl)phenyl}ether, 1,4-bis(4-aminophenoxy)benzene, 9,9-bis(4-aminophenyl)fluorene and a diamine compound obtained by introducing an alkyl group, an alkoxy group, a halogen atom or the like into an aromatic ring thereof, the aromatic diamine compound is not limited thereto.

Although examples of the alicyclic diamine compound include cyclobutanediamine, isophoronediamine, bicyclo[2,2,1]heptanebismethylamine, tricyclo[3,3,1,13,7]decane-1,3-diamine, 1,2-cyclohexyldiamine, 1,3-cyclohexyldiamine, cis-1,4-cyclohexyldiamine, 4,4'-diaminodicyclohexylmethane, 3,3'-dimethyl-4,4'-diaminodicyclohexylmethane, 3,3'-diethyl-4,4'-diaminodicyclohexylmethane, 3,3',5,5'-tetramethyl-4,4'-diaminodicyclohexylmethane, 3,3',5,5'-tetraethyl-4,4'-diaminodicyclohexylmethane, 3,5-diethyl-3',5'-dimethyl-4,4'-diaminodicyclohexylmethane, 4,4'-diaminodicyclohexyl ether, 3,3'-dimethyl-4,4'-diaminodicyclohexyl ether, 3,3'-diethyl-4,4'- diaminodicyclohexyl ether, 3,3',5,5'-tetramethyl-4,4'-diaminodicyclohexyl ether, 3,3',5,5'-tetraethyl-4,4'-diaminodicyclohexyl ether, 3,5-diethyl-3',5'-dimethyl-4,4'-diaminodicyclohexyl ether, 2,2-bis(4-aminocyclohexyl)propane, 2,2-bis(3-methyl-4-aminocyclohexyl)propane, 2,2-bis(3-ethyl-4-aminocyclohexyl)propane, 2,2-bis(3,5-dimethyl-4-aminocyclohexyl)propane, 2,2-bis(3,5-diethyl-4-aminocyclohexyl)propane, 2,2-(3,5-diethyl-3',5'-dimethyl-4,4'-diaminodicyclohexyl)propane and a diamine compound obtained by introducing an alkyl group, an alkoxy group, a halogen atom or the like into an alicyclic ring thereof, the alicyclic diamine compound is not limited thereto.

Although examples of the aliphatic diamine compound include alkylenediamines such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane and 1,10-diaminodecane, ethylene glycol diamines such as bis(aminomethyl)ether, bis(2-aminoethyl)ether and bis(3-aminopropyl)ether, and siloxane diamines such as 1,3-bis(3-aminopropyl)tetramethyldisiloxane, 1,3-bis(4-aminobutyl)tetramethyldisiloxane and α,ω-bis(3-aminopropyl)polydimethylsiloxane, the aliphatic diamine compound is not limited thereto.

These aromatic diamine compounds, alicyclic diamine compounds and aliphatic diamine compounds can be used alone or in combination of two or more thereof.

Of these, from the viewpoints of commercial availability and easy availability, and the viewpoint of optical properties, 4,4'-diaminodiphenyl sulfone is preferred.

Although the molecular weight of the polyimide precursor according to the present invention is not particularly limited, from the viewpoint of mechanical strength and the viewpoint of coating properties of a varnish, it is preferred that the weight average molecular weight lie within the range of 5000 to 200000. The weight average molecular weight of the polyimide precursor can be determined by the gel permeation chromatography (GPC) measurement.

With regard to the polyimide precursor according to the present invention, the terminal of polymer chain may be end-capped with an end-cap agent in order to adjust the molecular weight within the preferred range. Examples of the end-cap agent which reacts with an acid dianhydride include a monoamine, a monovalent alcohol and the like. Moreover, examples of the end-cap agent which reacts with a diamine compound include an acid anhydride, a monocarboxylic acid, a monoacid chloride compound, a monoactive ester compound, dicarbonates, vinyl ethers and the like. Moreover, by the use of end-cap agents for the end-capping reaction, any one of various organic groups can be introduced as a terminal group.

Examples of the monoamine used as an end-cap agent for the acid anhydride group terminal include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, ameride, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, 4,8-diethynyl-2-aminonaphthalene and the like, the monoamine is not limited thereto.

Examples of the monovalent alcohol used as an end-cap agent for the acid anhydride group terminal include methanol, ethanol, 1-propanol, 2-propanol, 1-butanol, 2-butanol, 1-pentanol, 2-pentanol, 3-pentanol, 1-hexanol, 2-hexanol, 3-hexanol, 1-heptanol, 2-heptanol, 3-heptanol, 1-octanol, 2-octanol, 3-octanol, 1-nonanol, 2-nonanol, 1-decanol, 2-decanol, 1-undecanol, 2-undecanol, 1-dodecanol, 2-dodecanol, 1-tridecanol, 2-tridecanol, 1-tetradecanol, 2-tetradecanol, 1-pentadecanol, 2-pentadecanol, 1-hexadecanol, 2-hexadecanol, 1-heptadecanol, 2-heptadecanol, 1-octadecanol, 2-octadecanol, 1-nonadecanol, 2-nonadecanol, 1-icosanol, 2-methyl-1-propanol, 2-methyl-2-propanol, 2-methyl-1-butanol, 3-methyl-1-butanol, 2-methyl-2-butanol, 3-methyl-2-butanol, 2-propyl-1-pentanol, 2-ethyl-1-hexanol, 4-methyl-3-heptanol, 6-methyl-2-heptanol, 2,4,4-trimethyl-1-hexanol, 2,6-dimethyl-4-heptanol, isononyl alcohol, 3,7-dimethyl-3-octanol, 2,4-dimethyl-1-heptanol, 2-heptylundecanol, ethylene glycol monoethyl ether, ethylene glycol monomethyl ether, ethylene glycol monobutyl ether, propylene glycol 1-methyl ether, diethylene glycol monoethyl ether, diethylene glycol monomethyl ether, diethylene glycol monobutyl ether, cyclopentanol, cyclohexanol, cyclopentane monomethylol, dicyclopentane monomethylol, tricyclodecane monomethylol, norborneol, terpineol and the like, the monovalent alcohol is not limited thereto.

Examples of the acid anhydride, monocarboxylic acid, monoacid chloride compound and monoactive ester compound used as end-cap agents for the amino group terminal include an acid anhydride such as phthalic anhydride, maleic anhydride, nasic anhydride, cyclohexane dicarboxylic acid anhydride and 3-hydroxyphthalic acid anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid and 8-ethynyl-2-naphthoic acid and a monoacid chloride compound obtained by the chlorination of carboxyl group thereof; and a monoacid chloride compound obtained by the chlorination of only the one carboxyl group of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene and 2,7-dicarboxynaphthalene; and an active ester compound obtained by a reaction of a monoacid chloride compound with N-hydroxybenzotriazole or N-hydroxy-5-norbornene-2,3-dicarboximide.

Examples of a dicarbonic acid ester compound used as an end-cap agent for the amino group terminal include di-tert-butyl dicarbonate, dibenzyl dicarbonate, dimethyl dicarbonate and diethyl dicarbonate.

Examples of a vinyl ether compound used as an end-cap agent for the amino group terminal include chloroformic acid esters such as tert-butyl chloroformate, n-butyl chloroformate, isobutyl chloroformate, benzyl chloroformate, allyl chloroformate, ethyl chloroformate and isopropyl chloroformate, isocyanate compounds such as butyl isocyanate, 1-naphthyl isocyanate, octadecyl isocyanate and phenyl isocyanate, butyl vinyl ether, cyclohexyl vinyl ether, ethyl vinyl ether, 2-ethylhexyl vinyl ether, isobutyl vinyl ether, isopropyl vinyl ether, n-propyl vinyl ether, tert-butyl vinyl ether, benzyl vinyl ether and the like.

Examples of other compounds used as an end-cap agent for the amino group terminal include benzyl chloroformate, benzoyl chloride, fluorenylmethyl chloroformate, 2,2,2-trichloroethyl chloroformate, allyl chloroformate, methanesulfonic acid chloride, p-toluenesulfonic acid chloride, phenyl isocyanate and the like.

The introduction ratio of the end-cap agent for the acid anhydride group terminal preferably lies within the range of 0.1 to 60% by mole, particularly preferably 5 to 50% by mole, relative to the acid dianhydride component. On the other hand, the introduction ratio of the end-cap agent for the amino group terminal lies within the range of 0.1 to 100% by mole, more preferably 1 to 90% by mole and particularly preferably 5 to 90% by mole, relative to the diamine component. By the use of a plurality of end-cap agents for end-capping reaction, plural different terminal groups may be introduced.

The end-cap agent introduced into a polyimide precursor can be easily detected by the following method. For example, by dissolving a polymer with an end-cap agent introduced therein in an acidic solution, decomposing the polymer into an amine component and acid anhydride component that are constitutional units of the polymer, and then subjecting these components to the gas chromatography (GC) and NMR measurement, the terminal-sealing agent can be easily detected.

Alternatively, by directly subjecting a polymer with end-cap agent introduced therein to pyrolysis gas chromatography (PGC) and the infrared spectrum and $^{13}$C NMR spectrum measurement, the end-cap agent can also be easily detected.

It is preferred that the polyimide precursor according to the present invention be composed of a polyimide precursor resin composition containing a solvent. As the solvent, polar aprotic solvents such as N-methyl-2-pyrrolidone, gamma-butyrolactone, N,N-dimethylformamide, N,N-dimethylacetamide and dimethyl sulfoxide; ethers such as tetrahydrofuran, dioxane and propylene glycol monomethyl ether; ketones such as acetone, methyl ethyl ketone, diisobutyl ketone and diacetone alcohol; esters such as ethyl acetate, propylene glycol monomethyl ether acetate and ethyl lactate; aromatic hydrocarbons such as toluene and xylene, and the like can be used alone or in combination of two or more thereof.

The content of the solvent is preferably 50 parts by weight or more, more preferably 100 parts by weight or more, preferably 2,000 parts by weight or less, and more preferably 1,500 parts by weight or less, relative to 100 parts by weight of the polyimide precursor. When the content lies within the range of 50 to 2,000 parts by weight, the viscosity suitable for coating is attained and the thickness after coating can be easily adjusted.

The polyimide precursor resin composition of the present invention may contain a surfactant. Examples of the surfactant include a fluorine-based surfactant such as Fluorad (trade name, available from Sumitomo 3M Limited), Megafac (trade name, available from DIC Corporation) and Surflon (trade name, available from ASAHI GLASS CO., LTD.). Moreover, examples thereof include an organic siloxane surfactant such as KP341 (trade name, available from Shin-Etsu Chemical Co., Ltd.), DBE (trade name, available from Chisso Corporation), Polyflow, Glanol (trade name, available from Kyoeisha Chemical Co., Ltd.) and BYK (available fromBYKJapanKK). Examples thereof include polyoxyalkylene lauryl ether such as EMULMIN (available from Sanyo Chemical Industries, Ltd.), polyoxyethylene lauryl ether, polyoxyethylene oleyl ether, and polyoxyethylene cetyl ether surfactants. Furthermore, examples thereof include an acrylic polymer surfactant such as Polyflow (trade name, available from Kyoeisha Chemical Co., Ltd.).

It is preferred that the surfactant be contained in an amount of 0.01 to 10 parts by weight relative to 100 parts by weight of the polyimide precursor resin composition.

The polyimide precursor resin composition of the present invention may contain an internal release agent. Examples of the internal release agent include a long-chain fatty acid such as stearic acid and lauric acid and the like.

The polyimide precursor resin composition of the present invention may contain a thermally crosslinking agent. As the thermally crosslinking agent, an epoxy compound and a compound having at least two alkoxymethyl groups or methylol groups are preferred. Having at least these two groups enables the agent to be subjected to a condensation reaction with a resin and a molecule of the same kind thereas to form a crosslinked structure and enables the mechanical strength and chemical resistance of a hardened film after heating treatment to be enhanced.

Although a preferred example of the epoxy compound can be exemplified by an epoxy group-containing silicone such as a bisphenol A type epoxy resin, a bisphenol F type epoxy resin, propylene glycol diglycidyl ether, polypropylene glycol diglycidyl ether, polymethyl (glycidyloxypropyl)siloxane, and the like, the epoxy compound in the present invention is not limited to these examples at all. Specifically, examples thereof include EPICLON 850-S, EPICLON HP-4032, EPICLON HP-7200, EPICLON HP-820, EPICLON HP-4700, EPICLON EXA-4710, EPICLON HP-4770, EPICLON EXA-859CRP, EPICLON EXA-1514, EPICLON EXA-4880, EPICLON EXA-4850-150, EPICLON EXA-4850-1000, EPICLON EXA-4816, EPICLON EXA-4822 (the above are trade names, available from DIC Corporation), RIKARESIN BEO-60E, RIKARESIN BPO-20E, RIKARESIN HBE-100, RIKARESIN DME-100 (the above are trade names, available from New Japan Chemical Co., Ltd.), EP-4003S, EP-4000S (the above are trade names, available from ADEKA CORPORATION), PG-100, CG-500, EG-200 (the above are trade names, available from Osaka Gas Chemical Co., Ltd.), NC-3000, NC-6000 (the above are trade names, available from Nippon Kayaku Co., Ltd.), EPDX-MK R508, EPDX-MK R540, EPDX-MK R710, EPDX-MK R1710, VG3101L, VG3101M80 (the above are trade names, available from Printec Corporation), CELLOXIDE 2021P, CELLOXIDE 2081, CELLOXIDE 2083, CELLOXIDE 2085 (the above are trade names, available from Daicel Chemical Industries, Ltd.) and the like.

Examples of the compound having at least two alkoxymethyl groups or methylol groups include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MEPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, HMOM-TP-HAP (the above are trade names, available from Honshu Chemical Industry Co., Ltd.), NIKALAC (registered trademark) MX-290, NIKALAC MX-280, NIKALAC MX-270, NIKALAC MX-279, NIKALAC MW-100LM and NIKALAC MX-750LM (the above are trade names, available from SANWA CHEMICAL CO., LTD.). Two or more thereof may be contained in the composition.

It is preferred that the thermally crosslinking agent be contained in an amount of 0.01 to 50 parts by weight relative to 100 parts by weight of the polyimide precursor resin.

The polyimide precursor resin composition of the present invention may contain a coloring agent. Adding the coloring agent enables the color tone of a heat-treated film of the polyimide precursor resin composition to be adjusted.

Although a dye, an organic pigment, an inorganic pigment and the like can be used as the coloring agent, an organic pigment is preferred from the points of heat resistance and transparency. Of these, one which is high in transparency and excellent in light resistance, heat resistance and chemical resistance is preferred. When specific examples of a typical organic pigment are expressed in terms of Color Index (CI) number, although the following ones are preferably used, any of the pigments is not limited thereto.

As an example of a yellow pigment, Pigment Yellow (hereinafter abbreviated as PY) 12, 13, 17, 20, 24, 83, 86, 93, 95, 109, 110, 117, 125, 129, 137, 138, 139, 147, 148, 150, 153, 154, 166, 168, 185 or the like is used. Moreover, as an example of an orange pigment, Pigment Orange (hereinafter abbreviated as PO) 13, 36, 38, 43, 51, 55, 59, 61, 64, 65, 71 or the like is used. Moreover, as an example of a red pigment, Pigment Red (hereinafter abbreviated as PR) 9, 48, 97, 122, 123, 144, 149, 166, 168, 177, 179, 180, 192, 209, 215, 216, 217, 220, 223, 224, 226, 227, 228, 240, 254 or the like is used. Moreover, as an example of a violet pigment, Pigment Violet (hereinafter abbreviated as PV) 19, 23, 29, 30, 32, 37, 40, 50 or the like is used. Moreover, as an example of a blue pigment, Pigment Blue (hereinafter abbreviated as PB) 15, 15:3, 15:4, 15:6, 22, 60, 64 or the like is used. Moreover, as an example of a green pigment, Pigment Green (hereinafter abbreviated as PG) 7, 10, 36, 58 or the like is used. These pigments have the possibility of being subjected to a surface treatment such as a treatment with rosin, a treatment with acidic groups and a basification treatment, as necessary.

The polyimide precursor resin composition of the present invention may contain an inorganic filler. Examples of the inorganic filler include silica fine particles, alumina fine particles, titania fine particles, zirconia fine particles and the like.

The shape of the inorganic filler is not particularly limited and examples thereof include a spherical shape, an elliptical shape, a flat shape, a rod-like shape, a fiber-like shape and the like.

For the sake of preventing light scattering, it is preferred that the diameter of particle contained therein be small. The average particle diameter is 0.5 to 100 nm and preferably lies within the range of 0.5 to 30 nm.

The content of the inorganic filler is preferably 1 to 50% by weight, more preferably 10 to 30% by weight, relative to the polyimide precursor. The flexibility and folding resistance are lowered with an increase in the content.

As a method of allowing the inorganic filler to be contained in the polyimide precursor resin composition, various known methods can be used. Examples thereof include a method of allowing an organo inorganic filler sol to be mixed with the polyimide precursor. The organo inorganic filler sol is one prepared by allowing an inorganic filler to be dispersed in an organic solvent in a proportion of about 30% by weight, and examples of the organic solvent include methanol, isopropanol, normal butanol, ethylene glycol, methyl ethyl ketone, methyl isobutyl ketone, propylene glycol monomethyl acetate, propylene glycol monomethyl ether, N,N-dimethylacetamide, N,N-dimethylformamide, N-methyl-2-pyrrolidone, 1,3-dimethylimidazolidinone, gamma-butyrolactone and the like.

In order to enhance the dispersibility of the inorganic filler in the polyimide precursor, the organo inorganic filler sol may be treated with a silane coupling agent. When the silane coupling agent has an epoxy group or an amino group as its terminal functional group, the affinity to the polyimide precursor is enhanced since the group is bonded to a carboxylic acid of the polyimide precursor, and more effective dispersing can be achieved.

Examples of the silane coupling agent having an epoxy group include 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane and the like.

Examples of the silane coupling agent having an amino group include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane and the like.

As a treatment method of the organo inorganic filler sol with a silane coupling agent, various known methods can be used. For example, the organo inorganic filler sol can be treated by adding a silane coupling agent to the organo inorganic filler sol in which the concentration has been adjusted and stirring the contents for 0.5 to 2 hours at room temperature to 80° C.

The polyimide precursor resin composition of the present invention may contain a photoacid generator. In the case where a photoacid generator is contained in the composition, the composition can be used as a positive type photosensitive resin composition since an acid is generated at the exposed part when irradiated with light via a mask on which an exposure pattern is drawn and the solubility of the exposed part to an aqueous alkali solution is increased.

Examples of the photoacid generator used in the present invention include a quinone diazide compound, a sulfonium salt, a phosphonium salt, a diazonium salt, an iodonium salt and the like. Of these, from the points of an excellent dissolution suppressing effect and being capable of attaining a positive type photosensitive resin composition having high sensitivity and ensuring a small reduction in film thickness, a quinone diazide compound is preferably used. Moreover, two or more kinds of photoacid generators may be contained in the composition. This enables the dissolving speed ratio of the exposed part to the unexposed part to be increased, and a positive type photosensitive resin composition with high sensitivity can be attained.

Examples of the quinone diazide compound include a polyhydroxy compound bonded with a sulfonic acid of the quinone diazide through an ester bond, a polyamino compound bonded with a sulfonic acid of the quinone diazide through a sulfonamide bond, a polyhydroxy polyamino compound bonded with a sulfonic acid of the quinone diazide through an ester bond and/or a sulfonamide bond, and the like. Although all functional groups in the polyhydroxy compound or the polyamino compound do not need to be substituted with quinone diazide, it is preferred that 50% by mole or more of all functional groups be substituted with quinone diazide. By using such a quinone diazide compound, a positive type photosensitive resin composition which initiates reaction by i-line (a wavelength of 365 nm), h-line (a wavelength of 405 nm) and g-line (a wavelength of 436 nm) of a mercury lamp which are general ultraviolet rays can be attained.

In the present invention, as the quinone diazide compound, either of a 5-naphthoquinonediazidesulfonyl group and a 4-naphthoquinonediazidesulfonyl group is preferably used. A compound having both these groups in the identical molecule may be used, and a compound having the one group and a compound having another group may be used in combination.

The quinone diazide compound used in the present invention is synthesized from a specific phenol compound by a method described below. Examples of the method include a method of reacting with a phenol compound and 5-naphthoquinonediazidesulfonyl chloride in the presence of triethylamine. Examples of a synthetic method of the phenol compound include a method of reacting an α-(hydroxyphenyl)styrene derivative with a polyhydric phenol compound in the presence of an acid catalyst, and the like.

The content of the photoacid generator is preferably 3 to 40 parts by weight relative to 100 parts by weight of the polyimide precursor. By allowing the content of the photoacid generator to lie within this range, the more highly enhanced sensitivity can be attained. Furthermore, a sensitizer and the like may be contained in the composition, as necessary.

In order to form a pattern of a positive type photosensitive resin, a varnish of the positive type photosensitive resin is coated on a substrate, and after an exposure, the exposed part is removed with a developing solution. As the developing solution, an aqueous solution of a compound exhibiting alkalinity such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine and hexamethylenediamine is preferred. In some cases, into these aqueous alkali solutions, polar solvents such as N-methyl-2-pyrrolidone, N,N-dimethylformamide, N,N-dimethylacetamide, dimethyl sulfoxide, gamma-butyrolactone and dimethylacrylamide; alcohols such as methanol, ethanol and isopropanol; esters such as ethyl lactate and propylene glycol monomethyl ether acetate; and ketones such as cyclopentanone, cyclohexanone, isobutyl ketone and methyl isobutyl ketone may be added alone or in combination of plural kinds thereof. It is preferred to perform a rinsing treatment with water after development. Here, alcohols such as ethanol and isopropyl alcohol, esters such as propylene glycol monomethyl ether acetate and the like may also be added in water for performing a rinsing treatment.

Following this, a production method of a polyimide precursor having a unit structure expressed by the general formula (1) and a unit structure expressed by the general formula (2) will be described. A polyimide precursor such as a polyamic acid, a polyamic acid ester and a polyamic acid silyl ester can be synthesized by a reaction of a diamine compound with an acid dianhydride or a derivative thereof. Examples of the derivative include a tetracarboxylic acid of the acid dianhydride, a mono-, di-, tri- or tetraester, acid chloride or the like of the tetracarboxylic acid, and specifically, examples thereof include a polyamic acid ester having a structure esterified with a methyl group, an ethyl group, an n-propyl group, an isopropyl group, an n-butyl group, a sec-butyl group, a tert-butyl group or the like. There is no particular restriction of the reaction method for a polymerization reaction as long as the aimed polyimide precursor is produced, and a known reaction method can be used.

Examples of the specific reaction method include a method of placing prescribed amounts of all of diamine components and a reaction solvent in a reactor, dissolving the components, placing a prescribed amount of an acid dianhydride component therein, and then stirring the contents for 0.5 to 30 hours at room temperature to 80° C., and the like. There is no particular restriction of the method for charging the acid dianhydride as long as the aimed polyimide precursor is produced. Two kinds of acid dianhydrides may be charged simultaneously or may be charged in several portions.

<Polyimide Resin Film>

Following this, a method of producing a resin film containing a polyimide (hereinafter "a polyimide resin film") with the polyimide precursor resin composition of the present invention will be described. The above-described surfactant, internal release agent, thermally crosslinking agent, coloring agent, inorganic filler, photoacid generator and the like may be contained in the polyimide resin film.

First, a polyimide precursor resin composition is coated on a substrate. Although, for example, a silicon wafer, metals, ceramics, gallium arsenide, soda-lime glass, alkali-free glass or the like is used as the substrate, the substrate is not limited thereto. Examples of the coating method include a slit die coating method, a spin coating method, a spray coating method, a roll coating method, a bar coating method or the like, and it does not matter if these methods are combined to coat the composition.

Next, the polyimide precursor resin composition coated on a substrate is dried and the solvent is removed to obtain a polyimide precursor resin composition film. For drying, a hot plate, an oven, infrared rays, a vacuum chamber and the like are used. In the case of using a hot plate, an object to be heated is held directly on the plate or on jigs such as proximity pins arranged on the plate, and is heated. Examples of the material of the proximity pin include a metallic material such as aluminum and stainless steel and a synthetic resin such as a polyimide resin and "Teflon" (registered trademark), and it does not matter if any proximity pin made of either material is used. Although the height of the proximity pin varies with the size of a substrate, the kind of a resin layer to be heated, the purpose of heating and the like, in the case of heating a resin layer coated on a glass substrate of 300 mm×350 mm×0.7 mm, for example, it is preferred that the height of the proximity pin be about 2 to 12 mm.

In particular, it is preferred that the composition be dried under vacuum with a vacuum chamber, and it is further preferred that heating for drying be performed additionally after vacuum drying and heating for drying be performed while drying the composition under vacuum. This enables shortening of the drying treatment time, and furthermore, a uniform coating film can be obtained. The temperature at the time of heating for drying varies with the kind of resin layer to be heated and the purpose, and it is preferred that the heating be performed for 1 minute to several hours at a temperature within the range of room temperature to 170° C. Although the room temperature is usually 20 to 30° C., the room temperature is preferably 25° C. Furthermore, the drying process may be performed several times under the same condition or under conditions different from one another.

Next, heating for imidization is performed. The polyimide precursor resin composition film is heated at a temperature within the range of 180° C. or higher and 650° C. or lower and converted to a polyimide resin film. This is defined as a thermal imidization process. It does not matter if the thermal imidization process is performed at the end of any process after the above-mentioned drying process.

The atmosphere for the thermal imidization process is not particularly limited, and the atmosphere may be air and may be inert gas such as nitrogen and argon. However, since colorless transparency is required for the polyimide resin film of the present invention, it is preferred that the film be heated under an atmosphere with an oxygen concentration of 5% or lower to perform the thermal imidization. In general, although the coloration by oxidation of a polyimide film on heating can be reduced and high transparency can be maintained by lowering the oxygen concentration, on the other hand, the oxygen concentration control in ppm order is often difficult at the production site. In the case of the polyimide resin film of the present invention, it is preferred that the oxygen concentration on thermal curing be 5% or lower because higher transparency can be maintained.

Moreover, the time required for the temperature of the film to reach a heating temperature for thermal imidization is not particularly limited, and a temperature raising method applicable to a heating system in a production line can be selected. For example, the temperature of the polyimide precursor resin film formed on a substrate may be raised in an oven from room temperature to a heating temperature for thermal imidization over a period of 5 to 120 minutes, or the polyimide precursor resin film formed on a substrate may be abruptly placed in an oven previously heated to a temperature within the range of 200° C. or higher and 650° C. or lower to perform a heating treatment. In general, in the case where the rate of temperature increase is high, the white turbidity of the film becomes significant. It is thought that this is because, in the case where a polyimide precursor film is heated rapidly, the solvent is remained even at a stage in which the thermal imidization proceeds, and due to the plasticizing effect thereof, crystallization and phase separation causing white turbidity easily proceed. With the polyimide precursor according to the present invention, a transparent polyimide resin film can be prepared irrespective of the curing condition. Thus, it is possible to select conditions under which the time required for the heating process can be shortened.

The polyimide resin film obtained as mentioned above has high transparency, high heat resistance, low CTE, chemical resistance and flexibility, and can be suitably used as a flexible substrate. As a transparent resin film, the light transmittance at a wavelength of 400 nm of a film with a thickness of 10 μm is preferably 80% or more, more preferably 85% or more, and further preferably 90% or more. With regard to CTE, the average value of 50° C. to 200° C. is preferably 50 ppm/° C. or less, more preferably 45 ppm/° C. or less, more preferably 35 ppm/° C. or less, more preferably 30 ppm/° C. or less, and further preferably 20 ppm/° C. or less.

With regard to chemical resistance, the polyimide according to the present invention exhibits excellent chemical resistance against an organic solvent such as acetone, propylene glycol monomethyl ether, N-methyl-2-pyrrolidone, gamma-butyrolactone and dimethyl sulfoxide; an acidic solution such as hydrochloric acid, nitric acid, phosphoric acid, acetic acid and oxalic acid; and a basic solution such as tetramethylammonium hydroxide.

With regard to heat resistance, the polyimide according to the present invention exhibits excellent heat resistance in the point that the significant reduction in weight is not caused at a temperature not higher than the curing temperature. When the mole ratio of the unit structures expressed by the general formula (1) and general formula (2) is 70/30 or more as described above, the polyimide exhibits especially excellent heat resistance in the points that wrinkles are not generated in a gas barrier layer forming process at a high temperature, and the like.

These physical property values are physical property values of a resin film, in the case where a surfactant, an internal release agent, a thermally crosslinking agent, a coloring agent, an inorganic filler, a photoacid generator and the like are contained in the polyimide resin film, in the state of allowing those to be contained therein.

The polyimide resin film of the present invention is suitably used as a flexible substrate for a display device, a light-receiving device, a circuit board, a TFT substrate and the like. In this case, the production of the display device, the light-receiving device, the circuit, the TFT and the like may be carried out on a polyimide resin film obtained after the polyimide resin film on a support substrate is peeled off from the support substrate, and may be carried out directly on a polyimide resin film without peeling off the polyimide resin film from the support substrate.

In the latter case, the display device, light-receiving device, circuit, TFT and the like are produced, after which the support substrate is peeled off. This method has an advantage such that a conventional process for processing a single sheet support substrate and facilities can be utilized. Moreover, since the polyimide resin film is fixed to the support substrate, the method is suitable for producing the display device, light-receiving device, circuit, TFT and the like with alignment precision. In the following description, although the latter method will be frequently described as a typical example, the former method is also acceptable in each case.

The method of peeling off a polyimide resin film on which the display device, light-receiving device, circuit, TFT and the like are formed from a substrate is not particularly limited. Examples of the peeling method include a method of immersing the film in water, a method of immersing the film in a chemical liquid such as hydrochloric acid and hydrofluoric acid, a method of irradiating the interface between a polyimide resin film and a substrate with a laser beam having a wavelength within the range from ultraviolet light to infrared light, and the like. Moreover, in order to facilitate the peeling, before a polyimide precursor resin composition is coated on a substrate, a release agent may be coated on a substrate and a sacrificial layer may be deposited thereon. Examples of the release agent include vegetable oil-based one, alkyd-based one, silicone-based one, fluorine-based one, aromatic polymer-based one, alkoxysilane-based one, and the like. Examples of the sacrificial layer include a metal film, a metal oxide film, an amorphous silicon film, and the like.

On the polyimide resin film of the present invention, an inorganic film which constitutes a gas barrier layer can be formed, and the polyimide resin film can be suitably used for a substrate with a gas barrier layer and a touch panel substrate.

The gas barrier layer on the polyimide resin film plays a role in preventing water vapor, oxygen and the like from permeating. In particular, in an organic electroluminescence element (organic EL element), since deterioration of the element by moisture is significant, it is necessary to impart the substrate with gas barrier property.

<Flexible Substrate>

A flexible substrate composed of a resin film containing the polyimide according to the present invention can be produced through at least the following processes of (1) to (3). Moreover, a flexible substrate having an inorganic film on a polyimide resin film can be produced through at least the following processes of (1) to (4).

(1) A process of applying a resin composition containing the polyimide precursor according to the present invention and a solvent on a support substrate, (2) a process of removing the solvent from the coated resin composition, (3) a process of obtaining a polyimide-containing resin film by imidizing the polyimide precursor in the resin composition, and (4) a process of forming a gas barrier layer on the polyimide-containing resin film.

A resin composition containing a polyimide precursor and a solvent is coated on a support substrate. Next, the solvent is removed from the coated resin composition by the drying method described above. Furthermore, the polyimide precursor in the resin composition is imidized by the thermal imidization described above to obtain a polyimide-containing resin film. On at least one side of the polyimide-containing resin film, a gas barrier layer is formed. By peeling off the polyimide-containing resin film from the support substrate, a flexible substrate can be produced.

The process of (4) may be one in which a gas barrier layer is formed directly above a polyimide-containing resin film, and may be one in which a gas barrier layer is formed while interposing another layer between the resin film and the gas barrier layer. A method of forming a gas barrier layer directly above a polyimide-containing resin film is preferred.

The support substrate is a hard one having a self-supporting property, and a substrate which has a smooth surface to be coated with the resin composition and has heat resistance is preferred. The base material is not particularly limited and examples thereof include glass, silicon, quartz, a ceramic such as alumina and sapphire, gallium arsenide, a metal such as iron, tin, zinc, copper, aluminum and stainless steel, a heat-resistant plastic film such as polyimide and polybenzoxazole, a fluororesin such as polytetrafluoroethylene and polyvinylidene fluoride, an epoxy resin, polyethylene terephthalate, polyethylene naphthalate, or the like. Of these, from the points of smoothness of the surface, being capable of peeling with a laser beam, being inexpensive and the like, glass is preferred. Although no particular limitation is put on the kind of glass, from the viewpoint of reducing metallic impurities, alkali-free glass is preferred.

As the material constituting the gas barrier layer, a metal oxide, a metal nitride and a metal oxynitride can be suitably used. Examples thereof include a metal oxide, a metal nitride and a metal oxynitride of aluminum (Al), silicon (Si), titanium (Ti), tin (Sn), zinc (Zn), zirconium (Zr), indium (In), niobium (Nb), molybdenum (Mo), tantalum (Ta), calcium (Ca) and the like. In particular, a gas barrier layer containing a metal oxide, a metal nitride and a metal oxynitride of at least Zn, Sn and In is preferred because the layer is high in bending resistance. Furthermore, a gas barrier layer in which the atomic concentration of Zn, Sn and In is 20 to 40% is preferred because the layer is higher in bending resistance. The composition of coexisting silicon dioxide and aluminum oxide in the gas barrier layer is also preferred because the layer is satisfactory in bending resistance.

For example, these inorganic gas barrier layers can be prepared by a vapor phase deposition method, in which a film is formed by depositing a material in a vapor phase, such as a sputtering method, a vacuum vapor deposition method, an ion plating method and a plasma CVD method. Of these, in the sputtering method, by reactive sputtering which is performed in an oxygen-containing atmosphere using a metal target, the film-forming rate can be enhanced.

The formation of a gas barrier layer may be performed on a layered body composed of a support substrate and a polyimide-containing resin film, and may be performed on a self-supporting film peeled off from the support substrate.

Since the polyimide resin of the present invention is high in heat resistance, it is possible to raise the substrate temperature to prepare a gas barrier layer. It is preferred that the film-forming temperature of the gas barrier layer be set to 80 to 400° C. It is advantageous for the enhancement of gas barrier performance to select a high film-forming temperature. Since the bending resistance is sometimes lowered when the film-forming temperature is high, in the use where emphasis is placed on bending resistance, it is preferred that the film-forming temperature for the gas barrier layer be 100 to 300° C. As described above, since the polyimide resin film of the present invention has excellent heat resistance, when the mole ratio of the unit structures expressed by the general formula (1) and general formula (2) is 70/30 or more, defects such as wrinkles are not generated in the film even in the case of forming a gas barrier layer at a high temperature (for example 300° C.)

No restriction is put on the layer number of gas barrier layers, and the layer may have a single layer structure composed only of one layer and may have a multilayer structure composed of two or more layers. Examples of a multilayer film include a gas barrier layer composed of a first constituent layer of SiO and a second constituent layer of SiN, and a gas barrier layer composed of a first constituent layer of SiO/AlO/ZnO and a second constituent layer of SiO.

In a process of preparing a light-emitting element and a light-receiving element on a gas barrier layer, various organic solvents are used. For example, with regard to a flexible color filter (hereinafter, "flexible CF"), a colored pixel, a black matrix and the like are formed on a gas barrier layer formed on a polyimide resin film to prepare a flexible CF. In this case, when the gas barrier layer is poor in solvent resistance, the gas barrier performance is lowered. Thus, it is preferred that the uppermost layer in gas barrier layers be imparted with solvent resistance, and for example, it is preferred that the uppermost layer in gas barrier layers be composed of silicon oxide.

The composition analysis of the gas barrier layer can be performed by quantitatively analyzing each element using X-ray photoelectron spectroscopy (XPS method).

The total thickness of the gas barrier layer or layers is preferably 20 to 600 nm, and further preferably 30 to 300 nm.

The thickness of the gas barrier layer can be usually measured by cross-section observation with a transmission electron microscope (TEM).

In the case where the clear interface cannot be visually confirmed with a TEM because the composition at the boundary region between an upper layer and a lower layer of the gas barrier-constituent layers gradually change and the like, first, the composition analysis in the thickness direction is performed to determine the concentration distribution of the element in the thickness direction, and then the boundary of layers and the thickness of the layer are determined based on the information of the concentration distribution. The procedure for the composition analysis in the thickness direction, and the definitions of the boundary of layers and the thickness of each layer will be described below.

First, the cross section of the gas barrier layer is observed with a transmission electron microscope to measure the whole thickness. Then, the following measurement which enables the composition analysis of an element in the thickness direction is applied to obtain a concentration distribution of the element corresponding to the thickness position in the gas barrier layer (a concentration profile in the thickness direction). Although examples of a composition analysis method to be applied in this case include electron energy loss spectroscopy (hereinafter referred to as EELS analysis), energy dispersive X-ray spectroscopy (hereinafter referred to as EDX analysis), secondary ion mass spectrometry (hereinafter referred to as SIMS analysis), X-ray photoelectron spectroscopy (hereinafter referred to as XPS analysis) and Auger electron spectroscopy (hereinafter referred to as AES analysis), from the viewpoints of sensitivity and accuracy, the EELS analysis is most preferred. Accordingly, first, the EELS analysis is performed, thereafter, the analyses written in parentheses are performed in the appearing order (EELS analysis→SIMS analysis→AES analysis→XPS analysis→EDX analysis), and with regard to a component which is not specified even by the higher-level analysis, data obtained by the lower-level analysis is applied to the component.

On at least one side of the polyimide resin film of the present invention, a transparent conductive layer can be formed. As the transparent conductive layer, although a known metal film, a metal oxide film and the like can be employed, of these, from the viewpoints of transparency, conductivity and mechanical properties, it is preferred that a metal oxide film be employed. Examples of the metal oxide film include a metal oxide film of an indium oxide, a cadmium oxide and a tin oxide, which are added with tin, tellurium, cadmium, molybdenum, tungsten, fluorine, zinc, germanium and the like as impurities; and a zinc oxide and a titanium oxide, which are added with aluminum as an impurity, and the like. Of these, a thin film of an indium oxide containing 2 to 15% by weight of a tin oxide or a zinc oxide is preferably used since the thin film is excellent in transparency and conductivity.

As a deposition method of the transparent conductive layer, although any method is acceptable as long as the deposition method by which the aimed thin film can be formed, for example, a vapor phase deposition method, in which a film is formed by depositing a material in a vapor phase, such as a sputtering method, a vacuum vapor deposition method, an ion plating method and a plasma CVD method, and the like are suitable. Of these, from the viewpoint of attaining particularly excellent conductivity and transparency, it is preferred that the layer be deposited by a sputtering method. The thickness of the transparent conductive layer is preferably 20 to 500 nm, and further preferably 50 to 300 nm.

<Flexible CF>

By forming a black matrix and a colored pixel on a flexible substrate which utilizes the polyimide resin film of the present invention, a flexible CF can be obtained. It is preferred that a resin used for at least one layer of the black matrix and a colored pixel layer contain a polyimide resin. Furthermore, it is preferred that the black matrix be composed of a low optical density layer and a high optical density layer formed on the low optical density layer, and a resin used for at least one layer of the low optical density layer and the high optical density layer contain a polyimide resin.

Since a user of a display panel senses light transmitted through a flexible CF, when a resin substrate with white turbidity is used, a displayed image is blurred. On the other hand, since a polyimide substrate with high transparency can be obtained by using the polyimide resin film of the present invention, a clear displayed image with no blur can be obtained.

Since the polyimide resin film of the present invention has high chemical resistance against a polar aprotic solvent general for the solvent of a polyimide precursor, a polyimide resin can be used for a black matrix and a colored pixel layer. Furthermore, even in the case of forming a gas barrier layer on a black matrix and a colored pixel layer, since the polyimide resin in the black matrix and the colored pixel layer is high in heat resistance, the resin has small gas evolution in a formation process of a gas barrier layer and is advantageous for film-forming of a gas barrier film which is high in gas barrier properties. Moreover, since the resin can be used as a polyimide precursor soluble in an aqueous alkali solution at the time of patterning of a black matrix and a colored pixel layer, the resin is advantageous for fine pattern formation.

An example of a configuration of a flexible CF will be described by reference to the drawings. FIG. 1A shows the basic configuration of a flexible CF including the polyimide resin film of the present invention formed on a support substrate. By peeling off the support substrate 1 from the resin film, a flexible CF in which the polyimide resin film of the present invention constitutes a substrate can be obtained.

Figure 1B:
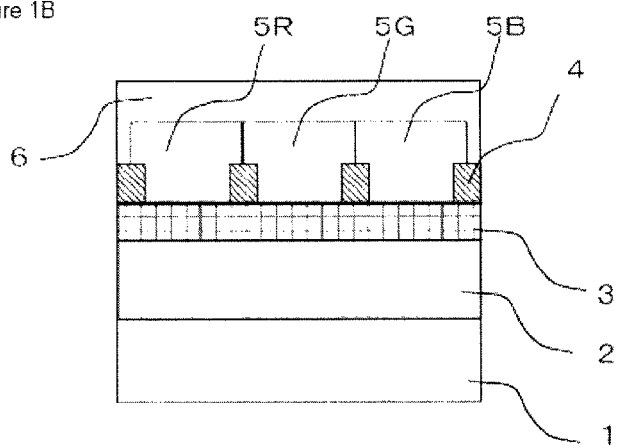
FIG. 1B is a cross-sectional view showing an example of a flexible CF.
Figure 1C:
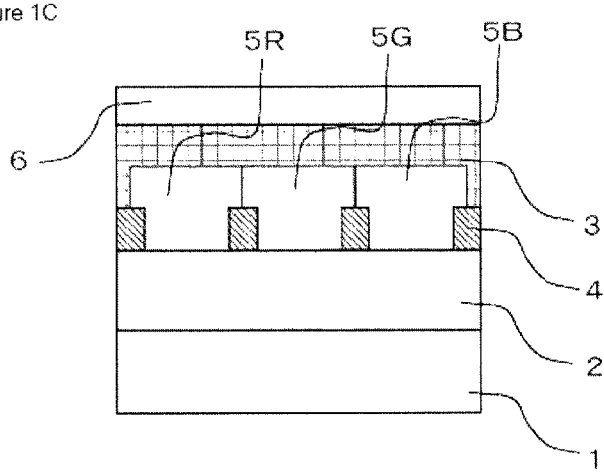
FIG. 1C is a cross-sectional view showing an example of a flexible CF.
Figure 1D:
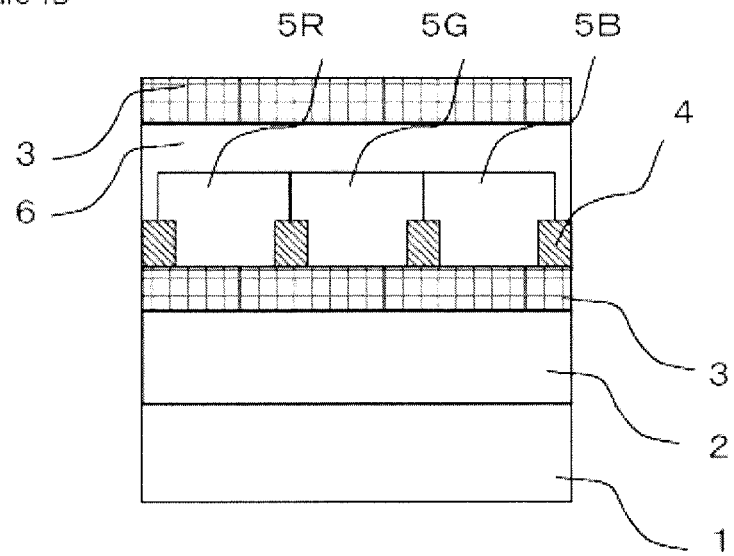
FIG. 1D is a cross-sectional view showing an example of a flexible CF.

A polyimide resin film 2 is formed on the support substrate 1, a black matrix 4, a red colored pixel 5R, a green colored pixel 5G and a blue colored pixel 5B are formed thereon, and furthermore, an overcoat layer 6 is provided. In this regard, the overcoat layer 6 is not essential, and an example in which the layer is not formed is acceptable. Moreover, FIG. 1B to FIG. 1D show modified examples of that in FIG. 1A, and a gas barrier layer 3, which is an inorganic film, is additionally formed. The position for forming the gas barrier layer 3 is not particularly limited, and for example, the layer may be formed on a polyimide resin film 2 (see FIG. 1B), may be formed on a black matrix 4 and a colored pixel layer 5 (see FIG. 1O) and may be formed on a flattening film 6 present on the surface of a color filter, and two layers thereof each may be formed on both of a polyimide resin film 2 and a overcoat layer 6, respectively (see FIG. 1D). Moreover, no restriction is put on the layer number of gas barrier layers, and the layer may have a single layer structure composed only of one layer and may have a multilayer structure composed of two or more layers. Examples of a multilayer film include a gas barrier layer composed of a first constituent layer of SiO and a second constituent layer of SiN, and a gas barrier layer composed of a first constituent layer of SiO/AlO/ZnO and a second constituent layer of SiO.

<Black Matrix>

It is preferred that the black matrix be a resin black matrix prepared by dispersing a black pigment in a resin. Examples of the black pigment include carbon black, titanium black, titanium oxide, titanium oxynitride, titanium nitride, or triiron tetraoxide. In particular, carbon black and titanium black are preferred. Moreover, a red pigment, a green pigment and a blue pigment are mixed to obtain a mixture, and the mixture can be used as a black pigment.

As a resin used for the resin black matrix, from the viewpoint of heat resistance and the viewpoint of easily forming a fine pattern, a polyimide resin is preferred. With regard to the polyimide resin, it is preferred that the polyimide resin be prepared by thermal curing of a polyamic acid synthesized from an acid anhydride and a diamine after patterning. As examples of the acid anhydride, the diamine and the solvent, those for the above-described polyimide resin can be used.

As a resin used for the resin black matrix, a photosensitive acrylic resin can also be used. The resin black matrix is composed of an alkali-soluble acrylic resin, a photopolymerizable monomer and a polymer dispersing agent and an additive, and is prepared by dispersing a black pigment therein.

Examples of the alkali-soluble acrylic resin include a copolymer of an unsaturated carboxylic acid and an ethylenic unsaturated compound. Examples of the unsaturated carboxylic acid include an acrylic acid, a methacrylic acid, an itaconic acid, a crotonic acid, a maleic acid, a fumaric acid, a vinylacetic acid or an acid anhydride.

Examples of the photopolymerizable monomer include trimethylolpropane tri(meth)acrylate, pentaerythritol tri (meth)acrylate, triacrylformal, pentaerythritol tetra(meth) acrylate, dipentaerythritol hexa(meth)acrylate or dipentaerythritol penta(meth)acrylate.

Examples of a photopolymerization initiator include benzophenone, N,N'-tetraethyl-4,4'-diaminobenzophenone, 4-methoxy-4'-dimethylaminobenzophenone, 2,2-diethoxyacetophenone, α-hydroxyisobutylphenone, thioxanthone or 2-chlorothioxanthone.

Examples of a solvent for dissolving a photosensitive acrylic resin include propylene glycol monomethyl ether acetate, propylene glycol monoethyl ether acetate, ethyl acetoacetate, methyl-3-methoxypropionate, ethyl-3-ethoxypropionate, methoxybutyl acetate or 3-methyl-3-methoxybutyl acetate.

In order to suppress the lowering in visibility due to reflection of external light, it is preferred that the black matrix be a layered resin black matrix composed of a low optical density layer and a high optical density layer formed on the low optical density layer. The low optical density layer refers to a layer with a layer constitution in which the optical density is not zero and is not substantially transparent, and refers to a layer in which a value of the optical density per unit thickness is smaller than that of the optical density per unit thickness of the high optical density layer. Although the resin constituting the layered resin black matrix is not particularly limited, from the viewpoint of patterning the low optical density layer and the high optical density layer simultaneously, it is preferred that the low optical density layer and the high optical density layer be composed of a polyimide resin and an acrylic resin, respectively.

Furthermore, in order to lower the reflectance, it is more preferred that fine particles be contained in the resin black matrix.

<Colored Pixel>

After a black matrix is formed, a colored pixel is formed. The colored pixel is composed of three colored pixels of red, green and blue. Moreover, by forming the fourth pixel which is colorless transparent or very slightly colored in addition to the three colored pixels, it is possible to enhance the brightness of white-color display in a display apparatus.

For the colored pixel of a color filter, a resin containing a pigment or a dye as a coloring agent can be used.

Examples of a pigment used for the red colored pixel include PR254, PR149, PR166, PR177, PR209, PY138, PY150 or PY139, examples of a pigment used for the green colored pixel include PG7, PG36, PG58, PG37, PB16, PY129, PY138, PY139, PY150 or PY185, and examples of a pigment used for the blue colored pixel include PB15:6 or PV23.

Examples of a blue dye include C.I. Basic Blue (BB) 5, BB7, BB9 or BB26, and examples of a red dye include C.I. Acid Red (AR) 51, AR87 or AR289.

Examples of a resin used for colored pixels of red, green and blue include an acryl-based resin, an epoxy-based resin or a polyimide-based resin. From the viewpoint of heat resistance, a polyimide resin is preferred, and in order to reduce the production costs of CF, a photosensitive acrylbased resin may be used.

For forming a colored pixel composed of a polyimide resin, a method of coating a non-photosensitive color paste composed of at least a polyamic acid, a coloring agent and a solvent on a substrate, drying the paste by air drying, heated-air drying, vacuum drying or the like, forming a non-photosensitive polyamic acid colored coating, forming a desired pattern with a positive type photoresist, stripping off the photoresist with alkali, and finally, heating the pattern for 1 minute to 3 hours at 200 to 300° C. to cure the colored layer (subject the colored layer to a polyimidization) is general.

It is general to contain an alkali-soluble acrylic resin, a photopolymerizable monomer and a photopolymerization initiator in the photosensitive acryl-based resin.

Examples of the alkali-soluble acrylic resin include a copolymer of an unsaturated carboxylic acid and an ethylenic unsaturated compound. Examples of the unsaturated carboxylic acid include an acrylic acid, a methacrylic acid, an itaconic acid, a crotonic acid, a maleic acid, a fumaric acid, a vinylacetic acid or an acid anhydride.

Examples of the photopolymerizable monomer include trimethylolpropane tri(meth)acrylate, pentaerythritol tri(meth)acrylate, triacrylformal, pentaerythritol tetra(meth)acrylate, dipentaerythritol hexa(meth)acrylate or dipentaerythritol penta(meth)acrylate.

Examples of a photopolymerization initiator include benzophenone, N,N'-tetraethyl-4,4'-diaminobenzophenone, 4-methoxy-4'-dimethylaminobenzophenone, 2,2-diethoxyacetophenone, α-hydroxyisobutylphenone, thioxanthone or 2-chlorothioxanthone.

Examples of a solvent for dissolving a photosensitive acryl-based resin include propylene glycol monomethyl ether acetate, propylene glycol monoethyl ether acetate, ethyl acetoacetate, methyl-3-methoxypropionate, ethyl-3-ethoxypropionate, methoxybutyl acetate or 3-methyl-3-methoxybutyl acetate.

In order to flatten the surface of a color filter provided with a black matrix and a colored pixel, an overcoat layer may be additionally formed on the color filter surface. Examples of a resin used for the formation of an overcoat layer include an epoxy resin, an acrylic epoxy resin, an acrylic resin, a siloxane resin or a polyimide resin. The thickness of the overcoat layer is preferably a thickness which makes the surface flat, more preferably 0.5 to 5.0 μm, and further preferably 1.0 to 3.0 μm.

<Production Method of Flexible CF>

A flexible CF utilizing the polyimide resin film of the present invention can be produced through at least the following processes.

(1) A process of applying a resin composition of the present invention on a support substrate, (2) a process of removing a solvent from the coated resin composition, (3) a process of obtaining a polyimide-containing resin film by imidizing the polyimide precursor in the resin composition, (4) a process of forming a black matrix and a colored pixel on the polyimide-containing resin film, and (5) a process of peeling off the polyimide-containing resin film from the support substrate.

A polyimide precursor resin composition is coated on a support substrate. Next, a solvent is removed from the coated resin composition by the drying method described above. Furthermore, a polyimide precursor in the resin composition is imidized by the thermal imidization described above to obtain a polyimide resin film. On the polyimide resin film, a black matrix and a colored pixel are formed. As described below, the photolithography is used for the pattern formation of the black matrix and the colored pixel. Presently, in a liquid crystal panel and an organic EL panel, achieving high definition of 300 ppi or more has been desired, and the performance equal to or greater than that thereof has been desired in a flexible display panel. The formation of a pattern with high precision is required for achieving such a high resolution. In the case of preparing a CF on a polyimide resin film formed on a support substrate, it is possible to apply the current technique for preparing a color filter on a glass substrate, and it is advantageous for forming a high-definition pattern as compared to the case of preparing a CF on a polyimide self-supporting film.

The process of (4) may be one in which a black matrix and a colored pixel are formed directly above a polyimide-containing resin film, and may be one in which those are formed while interposing another layer between the resin film and those.

The above-mentioned production process of a flexible CF may further include a process of forming an inorganic film. The position for forming a gas barrier layer which is an inorganic film is not particularly limited. For example, the layer may be formed on a polyimide resin film, may be formed on a black matrix and a colored pixel layer and may be formed on a overcoat layer present on the surface of a color filter, and two layers thereof each may be formed on both of a polyimide resin film and a flattening film, respectively. Moreover, no restriction is put on the layer number of gas barrier layers, the layer may have a single layer structure composed only of one layer and may have a multilayer structure composed of two or more layers. Examples of a multilayer film include a gas barrier layer composed of a first constituent layer of SiO and a second constituent layer of SiN, and a gas barrier layer composed of a first constituent layer of SiO/AlO/ZnO and a second constituent layer of SiO.

Next, an example of a production method for a flexible CF of the present invention will be described in detail. On a support substrate, a polyimide resin film and a gas barrier layer which is an inorganic film are prepared by the method mentioned above. A paste for a black matrix composed of a polyamic acid prepared by dispersing a black pigment composed of carbon black or titanium black is coated thereon by a method with a spin coater, a die coater or the like so that the thickness after curing becomes 1 μm, and is dried under reduced pressure of 60 Pa or lower, after which semi-curing is performed with a hot air oven or a hot plate at 110 to 140° C.

A positive type resist is coated by a method with a spin coater, a die coater or the like so that the thickness after prebaking becomes 1.2 μm, after which reduced pressure drying is performed to 80 Pa, and prebaking is performed with a hot air oven or a hot plate at 80 to 110° C. to form a resist film. Afterward, with a proximity exposure apparatus, a projection exposure apparatus or the like, an exposure with ultraviolet rays is selectively performed via a photomask, after which the exposed part is removed by immersing the resist film for 20 to 300 seconds in an alkaline developing solution composed of potassium hydroxide, tetramethylammonium hydroxide or the like of 1.5 to 3% by weight. The positive resist is stripped off by a stripper solution, and then the polyamic acid is heated for 10 to 60 minutes with a hot air oven or a hot plate at 200 to 300° C. and converted to a polyimide to form a resin black matrix.

A colored pixel is prepared with a coloring agent and a resin. In the case of using a pigment as a coloring agent, to a dispersion prepared by mixing a polymer dispersing agent and a solvent with the pigment and subjecting the mixture to a dispersing treatment, a polyamic acid is added to prepare a colored pixel. On the other hand, in the case of using a dye as a coloring agent, to the dye, a solvent and a polyamic acid are added to prepare a colored pixel. In this case, the whole solid content is the total of the polymer dispersing agent and the polyamic acid which are resin components and the coloring agent.

The coloring agent composition obtained is coated on a polyimide resin film provided with a resin black matrix by a method with a spin coater, a die coater or the like so that the thickness after a heating treatment becomes an aimed thickness of 0.8 to 3.0 μm, reduced pressure drying is performed to 80 Pa, and prebaking is performed with a hot air oven or a hot plate at 80 to 110° C. to form a coated film of a coloring agent.

Next, a positive type resist is coated by a method with a spin coater, a die coater or the like so that the thickness after prebaking becomes 1.2 μm, after which reduced pressure drying is performed to 80 Pa, and prebaking is performed with a hot air oven or a hot plate at 80 to 110° C. to form a resist film. Afterward, with a proximity exposure apparatus, a projection exposure apparatus or the like, an exposure with ultraviolet rays is selectively performed via a photomask, after which the exposed part is removed by immersing the resist film for 20 to 300 seconds in an alkaline developer composed of potassium hydroxide, tetramethylammonium hydroxide or the like of 1.5 to 3% by weight. The positive resist is stripped off by a stripper solution, after which the polyamic acid is heated for 10 to 60 minutes with a hot air oven or a hot plate at 200 to 300° C. and converted to a polyimide to form a colored pixel. By using a coloring agent composition prepared for each color of the colored pixel, such patterning processes mentioned above for a red colored pixel, a green colored pixel and a blue colored pixel are performed sequentially. The sequence of patterning for the colored pixels is not particularly limited.

Afterward, a polysiloxane resin is coated by a method with a spin coater, a die coater or the like, after which the resin is dried under vacuum, and prebaking is performed with a hot air oven or a hot plate at 80 to 110° C. By heating the resin for 5 to 40 minutes with a hot air oven or a hot plate at 150 to 250° C., it is possible to prepare a pixel of a flexible CF of the present invention.

<TFT Substrate>

The polyimide resin film of the present invention can be suitably used for a base material of a TFT substrate. That is, it is possible to obtain a TFT substrate provided with a TFT on the polyimide resin film of the present invention.

A TFT substrate utilizing the polyimide resin film of the present invention can be produced through at least the following processes.

(1) A process of applying a resin composition containing the polyimide precursor according to the present invention and a solvent on a substrate, (2) a process of removing the solvent from the coated resin composition, (3) a process of obtaining a polyimide-containing resin film by imidizing the polyimide precursor in the resin composition, (4) a process of forming a gas barrier layer on the polyimide-containing resin film, and (5) a process of forming a TFT on the polyimide-containing resin film.

A resin composition containing a polyimide precursor and a solvent is coated on a support substrate. Next, the solvent is removed from the coated resin composition by the drying method mentioned above. Furthermore, the polyimide precursor in the resin composition is imidized by the thermal imidization mentioned above to obtain a polyimide-containing resin film. On the polyimide-containing resin film, a gas barrier layer is formed, and then, a TFT is formed.

The process of (4) or (5) may be one in which a gas barrier layer or a TFT is formed directly above a polyimide-containing resin film, and may be one in which either of those is formed while interposing another layer between the resin film and either of those. A method of forming a gas barrier layer directly above a polyimide-containing resin film and forming a TFT thereon is preferred.

The polyimide film is not particularly restricted as long as the preparation of a gas barrier layer and a TFT is possible, either of the polyimide resin film of the present invention and a known polyimide resin film is acceptable. Examples of a semiconductor layer for forming a TFT include an oxide semiconductor typified by an amorphous silicon semiconductor, a polycrystalline silicon semiconductor and In—Ga—ZnO$^-_4$ and an organic semiconductor typified by pentacene and polythiophene. For example, by using the polyimide-containing resin film of the present invention as a base material, and sequentially forming a gas barrier film, a gate electrode, a gate insulation film, a semiconductor layer, an etching stopper film and a source-drain electrode by a known method, a bottom gate type TFT is prepared. A TFT substrate utilizing the polyimide-containing resin film can be produced through the process mentioned above. Such a TFT substrate can be used as a driving substrate for a liquid crystal device and an organic EL element.

Since a user of a bottom emission type organic EL panel senses light transmitted through a TFT substrate, when the substrate has white turbidity, a displayed image is blurred. On the other hand, since a polyimide substrate with high transparency can be obtained by using the polyimide according to the present invention, a clear displayed image can be obtained. Moreover, since the visibility of the alignment mark on a support substrate used for the alignment of each pattern at the time of forming a gate electrode, agate insulation film, a semiconductor layer, an etching stopper film and a source-drain electrode in the production of a TFT substrate is satisfactory, it is possible to prepare a TFT with high precision. As a result thereof, a TFT substrate satisfactory in drive performance can be obtained.

<Circuit Substrate>

A flexible substrate utilizing the polyimide resin film of the present invention can be used for a circuit substrate. No particular limitation is put on the circuit substrate, and examples thereof include one prepared by using the polyimide resin film of the present invention as a base film and forming any circuit thereon. For example, by utilizing the polyimide resin film of the present invention as a base film, subjecting a copper-clad laminate polyimide film (CCL) prepared by disposing copper foil on one side or both sides thereof through an adhesive layer to photoresist film formation, exposure/development, etching, resist-stripping, solder resist film formation and electrolytic gold plating, and sticking a cover lay film constituting a protective layer thereon, a circuit substrate can be obtained.

<Display Device, Light-Receiving Device>

A flexible substrate utilizing the polyimide according to the present invention can be used for a display device such as a liquid crystal display, an organic EL display, a touch panel and an electronic paper, a light-receiving device such as a solar cell and a CMOS, and the like. In particular, from an aspect of utilizing these display devices and light-receiving devices as foldable flexible devices, the flexible substrate according to the present invention is preferably used.

One example of a production process of a flexible device includes a process of forming a circuit required for a display device or a light-receiving device on a polyimide-containing resin film formed on a substrate, and peeling off the polyimide-containing resin film from the substrate using a known method such as laser radiation.

Figure 2:
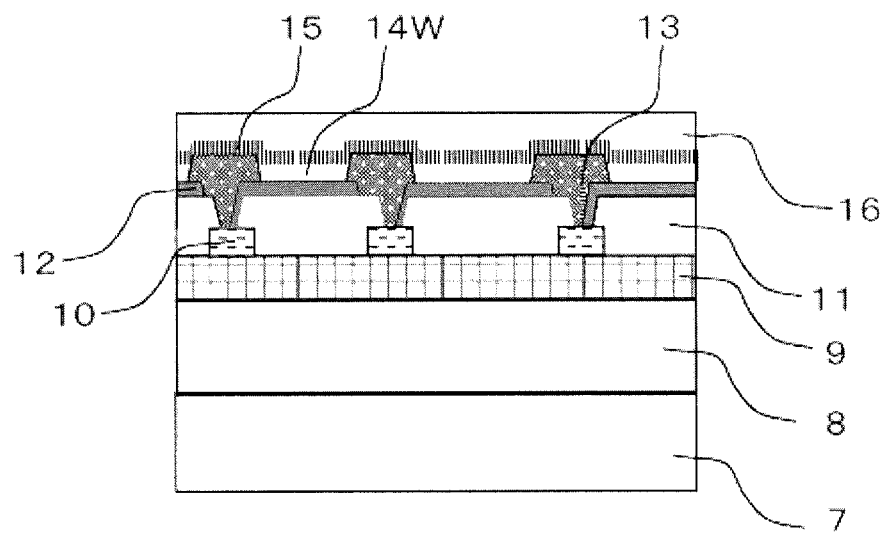
FIG. 2 is a cross-sectional view showing an example of an array composed of a flexible organic EL element.

For example, a flexible organic EL element array, which is an example of a flexible display device, equips a light-emitting element on a flexible substrate. For example, an example of the array composed of a flexible organic EL element (top emission system, white light-emitting organic EL) is illustrated in FIG. 2. A polyimide resin film 8 is formed on a support substrate 7, and a gas barrier layer 9, which is an inorganic film, is additionally formed thereon. On the layer, TFT 10 composed of amorphous, silicon, low-temperature polysilicon and oxide semiconductors and the like and a flattening layer 11 are provided. Furthermore, a white-color organic EL light-emitting layer 14W which has a first electrode 12 composed of Al/ITO and the like and an insulation film 13 covering the end of the first electrode 12 and is composed of a hole injection layer, a hole transport layer, alight-emitting layer, an electron transport layer and an electron injection layer is disposed, a second electrode 15 composed of ITO and the like is formed, and the array is sealed with a gas barrier layer 16. Thereafter, by peeling off the polyimide resin film 8 from the support substrate 7 using a known method such as laser radiation, the array can be used as a flexible organic EL element array.

With regard to the light extraction system, either of a bottom emission system in which light is extracted to the TFT substrate side and a top emission system in which light is extracted to the sealing substrate side is acceptable. As described above, by using the polyimide according to the present invention, a polyimide substrate high in transparency can be obtained. Thus, even in an organic EL panel of a bottom emission system, a clear displayed image can be obtained. Moreover, since the visibility of the alignment mark on a support substrate used for the alignment of each pattern at the time of forming a gate electrode, a gate insulation film, a semiconductor layer, an etching stopper film and a source-drain electrode in the production of a TFT substrate is satisfactory, it is possible to prepare a TFT with high precision. As a result thereof, a TFT substrate satisfactory in drive performance can be obtained. Furthermore, since a gas barrier layer can be formed on the polyimide resin film of the present invention even under a high temperature, it is possible to reduce the gas permeability of a panel. Thus, a flexible organic EL display in which the display quality/display reliability is high since there are few defects and the like including a dark spot, and moreover, there is no change in chromaticity can be obtained.

<Device Utilizing Flexible CF>

Moreover, the display device and the light-receiving device may be provided with the flexible CF of the present invention. For example, by combining the flexible CF of the present invention and a light-emitting element utilizing a flexible substrate, a flexible display device that displays full-color image can be obtained. This is an example of a display device prepared by bonding a flexible CF and a light-emitting element together. In particular, it is preferred to combine a light-emitting element provided with a white light-emitting type, for example a white light-emitting type organic EL element, and the flexible CF of the present invention.

Figure 3:
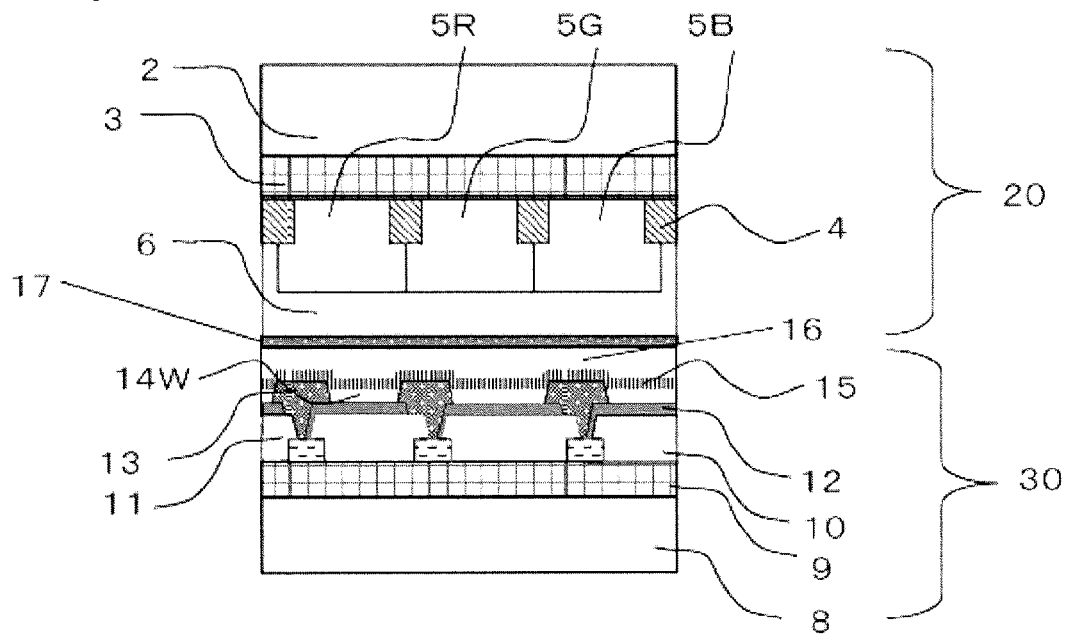
FIG. 3 is a cross-sectional view showing an example of a flexible display device.

An example of a flexible display device prepared by bonding the flexible CF of the present invention and a white light-emitting type organic EL element together is illustrated in FIG. 3. One example of the production process includes the following method. A flexible CF 20 of the present invention is formed on a first support substrate (not illustrated) by the above-described production method. Separately, a flexible organic EL element 30 in which a polyimide resin film constitutes a substrate is formed on a second support substrate (not illustrated) by the above-described method. Afterward, the flexible CF 20 and the flexible organic EL element 30 are bonded together with a glue layer 17 interposed therebetween. Afterward, each of the first and second support substrates is irradiated with a laser beam from the support substrate side to peel off each of the first and second support substrates.

The glue layer is not particularly limited, and examples thereof include one prepared by a tackiness agent, a tacky adhesive agent and an adhesive agent to be solidified by light or heat. The resin for the glue layer is not particularly limited, and examples thereof include an acrylic resin, an epoxy resin, a urethane resin, a polyamide resin, a polyimide resin, a silicone resin and the like.

The polyimide resin film formed on a second support substrate is not particularly limited, and either of the polyimide resin film of the present invention and a known polyimide resin film is acceptable. Examples of a known polyimide include a wholly aromatic polyimide in which pyromellitic acid dianhydride and/or 3,3',4,4'-biphenyltetracarboxylic acid dianhydride constitutes the acid component and para-phenylenediamine, 4,4'-diaminodiphenyl ether, 2,2'-dimethylbenzidine and/or 2,2'-ditrifluoromethyl-4,4'-diaminobiphenyl constitutes the diamine component.

The kind of a laser beam used for peeling off the first and second support substrates is not particularly limited as long as the peeling can be performed, and examples thereof include an excimer laser (wavelengths of 248, 308 and 351 nm), a YAG laser (wavelengths of 1064, 532 and 355 nm), a He—Ne laser (633 nm), a carbon dioxide laser (a wavelength of 1060 nm) and the like.

EXAMPLES

Hereinafter, the present invention will be described with reference to examples and the like, but the present invention should not be limited to these examples.

(1) Preparation of Polyimide Resin Film (10-μm Thickness)

On a 6-inch mirror silicon wafer, using a coater/developer Mark-7 available from Tokyo Electron Limited, a varnish was spin-coated so that the thickness after prebaking of 140° C.×4 minutes becomes 15±0.5 μm. Afterward, similarly using a hot plate in the Mark-7, a prebaking treatment of 140° C.×4 minutes was performed. Using an inert oven (INH-21CD available from Koyo Thermo Systems Co., Ltd.), under a stream of nitrogen (oxygen concentration of 20 ppm or lower), a coated film after the prebaking treatment was heated at a temperature increasing rate of 3.5° C./min to 300° C., held in place for 30 minutes, and cooled at a rate of 5° C./min to 50° C. to prepare a polyimide resin film. Subsequently, by being immersed for 1 to 4 minutes in hydrofluoric acid, the polyimide resin film was peeled off from a substrate and air-dried. The thickness of the polyimide resin film obtained was determined to be 10 μm.

(2) Preparation of Polyimide Resin Film (on Glass Substrate) (Hot Plate Cure)

On a glass substrate (TEMPAX) of 50 mm×50 mm×1.1 mm in thickness, using a spin coater MS-A200 available from MIKASA CO., LTD., a varnish was spin-coated so that the thickness after prebaking of 140° C.×4 minutes becomes 15±0.5 μm. Afterward, using a hot plate D-SPIN available from DAINIPPON SCREEN MFG. CO., LTD., a prebaking treatment of 140° C.×4 minutes was performed. A coated film after the prebaking treatment was held in place (in atmosphere) for 10 minutes over a hot plate (HP-1SA available from AS ONE CO., LTD.) at 300° C. to prepare a polyimide resin film (on the glass substrate). The thickness of the polyimide resin film obtained was determined to be 10 µm.

(3) Preparation of Polyimide Resin Film (on Glass Substrate) (Inert Oven Cure)

On a glass substrate (TEMPAX) of 50 mm×50 mm×1.1 mm in thickness, using a spin coater MS-A200 available from MIKASA CO., LTD., a varnish was spin-coated so that the thickness after prebaking of 140° C.×4 minutes becomes 15±0.5 µm. Afterward, using a hot plate D-SPIN available from DAINIPPON SCREEN MFG. CO., LTD., a prebaking treatment of 140° C.×4 minutes was performed. Using an inert oven (INH-21CD available from Koyo Thermo Systems Co., Ltd.), under a stream of nitrogen (oxygen concentration of 20 ppm or lower), a coated film after the prebaking treatment was heated at a temperature increasing rate of 3.5° C./min to 300° C., held in place for 30 minutes, and cooled at a rate of 5° C./min to 50° C. to prepare a polyimide resin film (on the glass substrate). The thickness of the polyimide resin film obtained was determined to be 10 µm.

(4) Appearance Inspection

A polyimide resin film on the glass substrate is visually inspected, and one in which white turbidity, cracking or foaming is observed is defined as "Presence" and the case where those are not observed is defined as "Absence". For the inspection, a polyimide resin film on the glass substrate (hot plate cure) prepared in (2) was used.

(5) Measurement of Light Transmittance (T)

Using an ultraviolet-visible spectrophotometer (MultiSpec1500 available from Shimadzu Corp.), the light transmittance at 400 nm was measured. For the measurement, a polyimide resin film on the glass substrate (inert oven cure) prepared in (3) was used.

(6) Measurement of Coefficient of Linear Thermal Expansion (CTE)

Using an apparatus for thermomechanical analysis (EX-STAR6000 TMA/SS6000 available from SII Nano Technology Inc.), the measurement was performed under a stream of nitrogen. Temperature raising method was described below. The adsorbed water of a sample was removed by heating the sample at a temperature increasing rate of 5° C./min to 150° C. in the first stage, and the sample was air-cooled at a temperature decreasing rate of 5° C./min to room temperature in the second stage. The actual measurement was performed at a temperature increasing rate of 5° C./min in the third stage to determine the CTE. Moreover, the CTE described in Examples is an average value of CTEs at 50° C. to 200° C. in the third stage. For the measurement, a polyimide resin film prepared in (1) was used.

(7) Chemical Resistance Test

A film is immersed for 10 minutes in NMP at 25° C., and one in which the film is not dissolved is defined as being Good (Circle) and one in which the film is dissolved is defined as being Poor (X mark). For the test, a polyimide resin film prepared in (1) was used.

(8) Heat Resistance Test on Forming Gas Barrier Layer

Using a target composed of silicon oxide, sputtering was performed under an argon atmosphere to form a gas barrier layer composed of a silicon oxide film with a thickness of 50 nm. In this case, the pressure was $2\times10^{-1}$ Pa, and the sputtering was performed using an AC power source of 13.56 MHz. With regard to the condition of the substrate temperature on sputtering, two temperature levels of 250° C. and 300° C. were employed. One in which wrinkles are not generated in a polyimide film even at a substrate temperature of 300° C. is defined as being Good (Circle), and one in which wrinkles are not generated at 250° C. but generated at 300° C. is defined as being Fair (Triangle). For the test, a polyimide resin film on the glass substrate (inert oven cure) prepared in (3) was used.

In this context, the abbreviation for a compound used in Examples will be described.

BPDA: 3,3',4,4'-biphenyl tetracarboxylic acid dianhydride

BSAA: 2,2-bis(4-(3,4-dicarboxyphenoxyl)phenyl)propane dianhydride

CHDA: trans-1,4-diaminocyclohexane

ODPA: 3,3',4,4'-oxydiphthalic dianhydride

6FDA: 4,4'-(hexafluoroisopropylidene)diphthalic anhydride i-BPDA: 2,2',3,3'-biphenyl tetracarboxylic acid dianhydride 3,3'-DDS: 3,3'-diaminodiphenylsulfone 4,4'-DDS: 4,4'-diaminodiphenylsulfone DCHM: 4,4'-diaminodicyclohexylmethane TFMB: 2,2'-bis(trifluoromethyl)benzidine PDA: paraphenylene diamine DAE: 4,4'-diaminodiphenyl ether SiDA: bis(3-aminopropyl)tetramethyldisiloxane NMP: N-methyl-2-pyrrolidone GBL: gamma-butyrolactone Preparation Example 1

Preparation of Polyimide Precursor Varnish

Under a stream of dry nitrogen, 129.0416 g (0.438 mol) of BPDA, 47.4290 g (0.438 mol) of PDA and 1000 g of NMP were placed in a 2000-mL four-necked flask and heated at 65° C. with stirring. After 6 hours, the contents were cooled to obtain a polyamic acid resin solution (the concentration of the resin of 15 wt %).

Preparation Example 2

Preparation of Polyimide Precursor Varnish

Together with 850 g of GBL and 850 g of NMP, 60.07 g (0.30 mol) of DAE, 70.29 g (0.65 mol) of PDA and 12.43 g (0.05 mol) of SiDA were placed, 309.43 g (0.9975 mol) of ODPA was added, and the contents were allowed to undergo a reaction for 3 hours at 80° C. To this, 1.96 g (0.02 mol) of maleic anhydride was added, and furthermore, the mixture were allowed to undergo a reaction for 1 hour at 80° C. to obtain a polyamic acid resin solution (the concentration of the resin of 20 wt %).

Preparation Example 3

Preparation of Black-Colored Light-Blocking Agent Composition for Forming Black Matrix Into 250 g of a polyimide precursor varnish in Preparation Example 1, 50 g of carbon black (MA100; available from Mitsubishi Chemical Corporation) and 200 g of NMP were mixed, and using the DYNO-MILL KDL-A, the mixture was subjected to a dispersing treatment for 3 hours at 3200 rpm using zirconia beads with a diameter of 0.3 mm to obtain a light-blocking agent dispersion 1.

To 50 g of this light-blocking agent dispersion 1, 49.9 g of NMP and 0.1 g of a surfactant (LC951; available from Kusumoto Chemicals, Ltd.) were added to obtain a non-photosensitive light-blocking agent composition.

Preparation Example 4

Preparation of Photosensitive Red-Colored Coloring Agent Composition for Forming Red Colored Pixel As a coloring agent, 50 g of PR177 (CHROMOFINE (registered trademark) RED 6125EC; available from Dainichiseika Color & Chemicals Mfg. Co Ltd.) and 50 g of PR254 (IRGAPHOR (registered trademark) RED BK-CF; available from Ciba Specialty Chemicals Inc.) were mixed. Into this coloring agent, 100 g of a polymer dispersing agent (BYK2000; resin concentration of 40 wt %; available from BYK Japan KK), 67 g of an alkali-soluble resin (CY-CLOMER (registered trademark) ACA250; resin concentration of 45 wt %; available from Daicel Chemical Industries, Ltd.), 83 g of propylene glycol monomethyl ether and 650 g of propylene glycol monomethyl ether acetate were mixed to prepare a slurry. A beaker containing the slurry was connected to a circulation type bead mill dispersing machine (DYNO-MILL KDL-A; available from Willy et Bakkofen Co., Ltd.) via a tube, and the slurry was subjected to a dispersing treatment for 4 hours at 3200 rpm using zirconia beads with a diameter of 0.3 mm as media to obtain a coloring agent dispersion.

To 45.7 g of this coloring agent dispersion, 7.8 g of CYCLOMERACA250, 3.3 g of a photopolymerizable monomer (KAYARAD (registered trademark) DPHA; available from Nippon Kayaku Co., Ltd.), 0.2 g of a photopolymerization initiator (IRGACURE (registered trademark) 907; available from Ciba Specialty Chemicals Inc.), 0.1 g of a photopolymerization initiator (KAYACURE (registered trademark) DETX-S; available from Nippon Kayaku Co., Ltd.), 0.03 g of a surfactant (BYK333; available from BYK Japan KK) and 42.9 g of propylene glycol monomethyl ether acetate were added to obtain a coloring agent composition. The concentration of the coloring agent in the whole solid content of the coloring agent composition was determined to be 31 wt %, and the weight mixing ratio of each coloring agent was determined as PR177:PR254=50:50.

Preparation Example 5

Preparation of Photosensitive Green-Colored Coloring Agent Composition for Forming Green Colored Pixel As a coloring agent, 65 g of PG7 (Hostaperm (registered trademark) Green GNX; available from Clariant Japan K.K.) and 35 g of PY150 (E4GNGT; available from LANXESS K.K.) were mixed. Into this coloring agent, 100 g of BYK2000, 67 g of CYCLOMER ACA250, 83 g of propylene glycol monomethyl ether and 650 g of propylene glycol monomethyl ether acetate were mixed, and using the DYNO-MILL KDL-A, the mixture was subjected to a dispersing treatment for 6 hours at 3200 rpm using zirconia beads with a diameter of 0.3 mm to obtain a coloring agent dispersion.

To 51.7 g of this coloring agent dispersion, 6.3 g of CYCLOMER ACA250, 2.9 g of KAYARAD DPHA, 0.2 g of IRGACURE 907, 0.1 g of KAYACURE DETX-S, 0.03 g of BYK333 and 38.8 g of propylene glycol monomethyl ether acetate were added to obtain a coloring agent composition. The concentration of the coloring agent in the whole solid content of the coloring agent composition was determined to be 35 wt %, and the equation of PG7:PY150=65:35 (weight ratio) holds for the coloring agent.

Preparation Example 6

Preparation of Photosensitive Blue-Colored Coloring Agent Composition for Forming Blue Colored Pixel As a coloring agent, 100 g of PB15:6 (LIONOL (registered trademark) BLUE 7602; available from TOYO INK CO., LTD.) was used, and into this coloring agent, 100 g of BYK2000, 67 g of CYCLOMER ACA250, 83 g of propylene glycol monomethyl ether and 650 g of propylene glycol monomethyl ether acetate were mixed to prepare a slurry. Using a dispersing machine DYNO-MILL KDL-A, the slurry was subjected to a dispersing treatment for 3 hours at 3200 rpm using zirconia beads with a diameter of 0.3 mm to obtain a coloring agent dispersion.

To 41.3 g of this coloring agent dispersion, 8.9 g of CYCLOMER ACA250, 3.5 g of KAYARAD DPHA, 0.2 g of IRGACURE 907, 0.1 g of KAYACURE DETX-S, 0.03 g of BYK333 and 46 g of propylene glycol monomethyl ether acetate were added to obtain a coloring agent composition. The concentration of the coloring agent in the whole solid content of the coloring agent composition was determined to be 28 wt %, and the coloring agent is composed only of PB15:6.

Preparation Example 7

Preparation of Non-Photosensitive Red-Colored Coloring Agent Composition for Forming Red Colored Pixel With 3.6 g (80 wt %) of Pigment Red PR254 and 0.9 g (20 wt %) of Pigment Red PR177, 22.5 g of a polymer dispersing agent (PD) and 63 g of NMP were mixed to prepare a slurry. Using a dispersing machine DYNO-MILL KDL-A, the slurry was subjected to a dispersing treatment for 3 hours at 3200 rpm using zirconia beads with a diameter of 0.3 mm to obtain a coloring agent dispersion.

To 45.6 g of this coloring agent dispersion, 18.2 g of a polyimide precursor varnish prepared in Preparation Example 1, 0.1 g of 3-aminopropyltriethoxysilane as an adhesion improving agent, 0.03 g of an acrylic surfactant as a surfactant and a suitable amount of NMP were added and mixed to obtain a red-colored color paste (PR-1) having a pigment/resin ratio of 25/75 (wt/wt) and a solid content concentration of 6% and containing NMP as a solvent in 94 wt % content.

Preparation Example 8

Preparation of Non-Photosensitive Green-Colored Coloring Agent Composition for Forming Green Colored Pixel With 2.7 g (60 wt %) of Pigment Green PG36 and 1.8 g (40 wt %) of Pigment Yellow PY150, 22.5 g of a polymer dispersing agent (PD) and 63 g of NMP were mixed to prepare a slurry. Using a dispersing machine DYNO-MILL KDL-A, the slurry was subjected to a dispersing treatment for 3 hours at 3200 rpm using zirconia beads with a diameter of 0.3 mm to obtain a coloring agent dispersion.

To 45.6 g of this coloring agent dispersion, 18.2 g of a polyimide precursor varnish prepared in Preparation Example 1, 0.1 g of 3-aminopropyltriethoxysilane as an adhesion improving agent, 0.03 g of an acrylic surfactant as a surfactant and a suitable amount of NMP were added and mixed to obtain a green-colored color paste (PG-1) having a pigment/resin ratio of 25/75 (wt/wt) and a solid content concentration of 6% and containing NMP as a solvent in 94 wt % content.

Preparation Example 9

Preparation of Non-Photosensitive Blue-Colored Coloring Agent Composition for Forming Blue Colored Pixel With 4.5 g of Pigment Blue PB15:6, 22.5 g of a polymer dispersing agent (PD) and 63 g of N-methyl pyrrolidone were mixed to prepare a slurry. Using a dispersing machine DYNO-MILL KDL-A, the slurry was subjected to a dispersing treatment for 3 hours at 3200 rpm using zirconia beads with a diameter of 0.3 mm to obtain a coloring agent dispersion.

To 45.6 g of this coloring agent dispersion, 18.2 g of a polyimide precursor varnish prepared in Preparation Example 1, 0.1 g of 3-aminopropyltriethoxysilane as an adhesion improving agent, 0.03 g of an acrylic surfactant as a surfactant and a suitable amount of NMP were added and mixed to obtain a blue-colored color paste (PB-1) having a pigment/resin ratio of 25/75 (wt/wt) and a solid content concentration of 6 wt % and containing NMP as a solvent in 94 wt % content.

Preparation Example 10

Preparation of Resin Composition for Forming Transparent Protective Film

To 65.05 g of trimellitic acid, 280 g of GBL and 74.95 g of γ-aminopropyltriethoxysilane were added and heated for 2 hours at 120° C. To 20 g of the resulting solution, 7 g of bisphenoxyethanol fluorene diglycidyl ether and 15 g of diethylene glycol dimethyl ether were added to obtain a resin composition.

Preparation Example 11

Synthesis of Polysiloxane Solution

Into a 500-ml three-necked flask, 81.72 g (0.60 mol) of methyltrimethoxysilane, 59.49 g (0.30 mol) of phenyltrimethoxysilane, 24.64 g (0.10 mol) of 2-(3,4-epoxycyclohexyl)ethyltrimethoxysilane and 163.1 g of diacetone alcohol were charged, and an aqueous phosphoric acid solution prepared by dissolving 0.54 g (0.3 wt % amount relative to the charged monomer) of phosphoric acid in 55.8 g of water was added over a period of 10 minutes with stirring at room temperature. Afterward, the flask was immersed in an oil bath at 40° C. and the contents were stirred for 30 minutes, after which the temperature of the oil bath was raised to 115° C. over a period of 30 minutes. At the end of 1 hour after the initiation of the temperature rise, the inside temperature of the solution reached 100° C., and then, the contents were heated for 1.5 hours with stirring (the inside temperature of 100 to 110° C.) to obtain a polysiloxane solution. In this connection, nitrogen was allowed to flow at a rate of 0.05 l (liter)/min while the contents were heated with stirring.

During the reaction, a total of 131 g of methanol and water, which are by-products, was distilled.

The solid content concentration in the resulting polysiloxane solution was determined to be 43 wt %, and the weight average molecular weight of polysiloxane was determined to be 4200. The content ratio of the phenyl group-substituted silane in the polysiloxane was determined to be 30 mol % in terms of the atomic mole ratio of Si.

Preparation Example 12

Preparation of Photosensitive Positive Type Transparent Resist

Under a yellow light, 15.43 g of a polysiloxane solution obtained in the above-mentioned synthesis, 0.59 g of a quinone diazide compound, 3.73 g of diacetone alcohol as a solvent and 9.84 g of propylene glycol monomethyl ether acetate were mixed and stirred to give a homogeneous solution, after which the solution was filtered through a filter of 0.45 μm to prepare a photosensitive positive type transparent resist.

Example 1

Under a stream of dry nitrogen, 15.2078 g (51.7 mmol) of BPDA, 0.6898 g (1.3 mmol) of BSAA, 6.0536 g (53.0 mmol) of CHDA and 100 g of NMP were placed in a 200-mL four-necked flask and heated at 65° C. with stirring. After 6 hours, the contents were cooled to prepare a varnish.

Example 2

Under a stream of dry nitrogen, 14.6181 g (49.7 mmol) of BPDA, 1.3611 g (2.6 mmol) of BSAA, 5.9721 g (52.3 mmol) of CHDA and 100 g of NMP were placed in a 200-mL four-necked flask and heated at 65° C. with stirring. After 6 hours, the contents were cooled to prepare a varnish.

Example 3

Under a stream of dry nitrogen, 13.4852 g (45.8 mmol) of BPDA, 2.6507 g (5.1 mmol) of BSAA, 5.8153 g (50.9 mmol) of CHDA and 100 g of NMP were placed in a 200-mL four-necked flask and heated at 65° C. with stirring. After 6 hours, the contents were cooled to prepare a varnish.

Example 4

Under a stream of dry nitrogen, 11.3890 g (38.7 mmol) of BPDA, 5.0369 g (9.7 mmol) of BSAA, 5.8153 g (48.4 mmol) of CHDA and 100 g of NMP were placed in a 200-mL four-necked flask and heated at 65° C. with stirring. After 6 hours, the contents were cooled to prepare a varnish.

Example 5

Under a stream of dry nitrogen, 9.4920 g (32.3 mmol) of BPDA, 7.1965 g (13.8 mmol) of BSAA, 5.2628 g (46.1 mmol) of CHDA and 100 g of NMP were placed in a 200-mL four-necked flask and heated at 65° C. with stirring. After 6 hours, the contents were cooled to prepare a varnish.

Example 6

Under a stream of dry nitrogen, 7.767 g (26.4 mmol) of BPDA, 9.1601 g (17.6 mmol) of BSAA, 5.0241 g (44.0 mmol) of CHDA and 100 g of NMP were placed in a 200-mL four-necked flask and heated at 65° C. with stirring. After 6 hours, the contents were cooled to prepare a varnish.

Example 7

Under a stream of dry nitrogen, 6.1917 g (21.0 mmol) of BPDA, 10.9534 g (21.0 mmol) of BSAA, 4.8061 g (42.0 mmol) of CHDA and 100 g of NMP were placed in a 200-mL four-necked flask and heated at 65° C. with stirring. After 6 hours, the contents were cooled to prepare a varnish.

Example 8

Under a stream of dry nitrogen, 4.7474 g (16.1 mmol) of BPDA, 12.5976 g (24.2 mmol) of BSAA, 4.6063 g (40.3 mmol) of CHDA and 100 g of NMP were placed in a 200-mL four-necked flask and heated at 65° C. with stirring. After 6 hours, the contents were cooled to prepare a varnish.

Example 9

Under a stream of dry nitrogen, 12.8128 g (43.5 mmol) of BPDA, 1.2592 g (2.4 mmol) of BSAA, 1.0748 g (2.4 mmol) of 6FDA, 5.5253 g (48.3 mmol) of CHDA and 88 g of NMP were placed in a 200-mL four-necked flask and heated at 65° C. with stirring. After 6 hours, the contents were cooled to prepare a varnish.

Example 10

Under a stream of dry nitrogen, 13.9135 g (47.3 mmol) of BPDA, 0.6837 g (1.3 mmol) of BSAA, 1.7507 g (3.9 mmol) of 6FDA, 6.0 g (52.5 mmol) of CHDA and 100 g of NMP were placed in a 200-mL four-necked flask and heated at 65° C. with stirring. After 6 hours, the contents were cooled to prepare a varnish.

Example 11

Under a stream of dry nitrogen, 14.8411 g (50.4 mmol) of BPDA, 2.1879 g (4.2 mmol) of BSAA, 0.6225 g (1.4 mmol) of 6FDA, 6.0 g (52.5 mmol) of CHDA and 99 g of NMP were placed in a 200-mL four-necked flask and heated at 65° C. with stirring. After 6 hours, the contents were cooled to prepare a varnish.

Example 12

Under a stream of dry nitrogen, 13.0783 g (44.5 mmol) of BPDA, 2.5707 g (4.4 mmol) of BSAA, 5.0758 g (44.5 mmol) of CHDA, 1.2263 g (4.9 mmol) of 4,4'-DDS and 100 g of NMP were placed in a 200-mL four-necked flask and heated at 65° C. with stirring. After 6 hours, the contents were cooled to prepare a varnish.

Comparative Example 1

Under a stream of dry nitrogen, 15.8137 g (53.7 mmol) of BPDA, 6.1375 g (53.7 mmol) of CHDA and 100 g of NMP were placed in a 200-mL four-necked flask and heated at 65° C. with stirring. After 6 hours, the contents were cooled to prepare a varnish.

Comparative Example 2

Under a stream of dry nitrogen, 14.1769 g (48.2 mmol) of BPDA, 1.6608 g (5.4 mmol) of ODPA, 6.1135 g (53.5 mmol) of CHDA and 100 g of NMP were placed in a 200-mL four-necked flask and heated at 65° C. with stirring. After 6 hours, the contents were cooled to prepare a varnish.

Comparative Example 3

Under a stream of dry nitrogen, 12.5527 g (42.7 mmol) of BPDA, 3.3087 g (10.7 mmol) of ODPA, 6.0898 g (53.4 mmol) of CHDA and 100 g of NMP were placed in a 200-mL four-necked flask and heated at 65° C. with stirring. After 6 hours, the contents were cooled to prepare a varnish.

Comparative Example 4

Under a stream of dry nitrogen, 10.9411 g (37.2 mmol) of BPDA, 4.9439 g (15.9 mmol) of ODPA, 6.0662 g (53.1 mmol) of CHDA and 100 g of NMP were placed in a 200-mL four-necked flask and heated at 65° C. with stirring. After 6 hours, the contents were cooled to prepare a varnish.

Comparative Example 5

Under a stream of dry nitrogen, 14.7521 g (50.1 mmol) of BPDA, 1.1723 g (2.6 mmol) of 6FDA, 6.0268 g (52.7 mmol) of CHDA and 100 g of NMP were placed in a 200-mL four-necked flask and heated at 65° C. with stirring. After 6 hours, the contents were cooled to prepare a varnish.

Comparative Example 6

Under a stream of dry nitrogen, 13.7281 g (46.7 mmol) of BPDA, 2.3031 g (5.2 mmol) of 6FDA, 5.9200 g (51.9 mmol) of CHDA and 100 g of NMP were placed in a 200-mL four-necked flask and heated at 65° C. with stirring. After 6 hours, the contents were cooled to prepare a varnish.

Comparative Example 7

Under a stream of dry nitrogen, 11.7852 g (40.1 mmol) of BPDA, 4.4486 g (10.0 mmol) of 6FDA, 5.7174 g (50.1 mmol) of CHDA and 100 g of NMP were placed in a 200-mL four-necked flask and heated at 65° C. with stirring. After 6 hours, the contents were cooled to prepare a varnish.

Comparative Example 8

Under a stream of dry nitrogen, 9.9708 g (33.9 mmol) of BPDA, 6.4521 g (14.5 mmol) of 6FDA, 5.5283 g (48.4 mmol) of CHDA and 100 g of NMP were placed in a 200-mL four-necked flask and heated at 65° C. with stirring. After 6 hours, the contents were cooled to prepare a varnish.

Comparative Example 9

Under a stream of dry nitrogen, 14.2324 g (48.4 mmol) of BPDA, 1.5814 g (5.4 mmol) of i-BPDA, 6.1375 g (53.8 mmol) of CHDA and 100 g of NMP were placed in a 200-mL four-necked flask and heated at 65° C. with stirring. After 6 hours, the contents were cooled to prepare a varnish.

Comparative Example 10

Under a stream of dry nitrogen, 13.7278 g (46.7 mmol) of BPDA, 1.6082 g (5.2 mmol) of ODPA, 5.3279 g (46.7 mmol) of CHDA, 1.2873 g (5.2 mmol) of 3,3'-DDS and 100 g of NMP were placed in a 200-mL four-necked flask and heated at 65° C. with stirring. After 6 hours, the contents were cooled to prepare a varnish.

Comparative Example 11

Under a stream of dry nitrogen, 13.7278 g (46.7 mmol) of BPDA, 1.6082 g (5.2 mmol) of ODPA, 5.3279 g (46.7 mmol) of CHDA, 1.2873 g (5.2 mmol) of 4,4'-DDS and 100 g of NMP were placed in a 200-mL four-necked flask and heated at 65° C. with stirring. After 6 hours, the contents were cooled to prepare a varnish.

Comparative Example 12

Under a stream of dry nitrogen, 13.4985 g (45.9 mmol) of BPDA, 1.5813 g (5.1 mmol) of ODPA, 5.2389 g (45.9 mmol) of CHDA, 1.6324 g (5.1 mmol) of TFMB and 100 g of NMP were placed in a 200-mL four-necked flask and heated at 65° C. with stirring. After 6 hours, the contents were cooled to prepare a varnish.

Comparative Example 13

Under a stream of dry nitrogen, 13.8520 g (47.1 mmol) of BPDA, 1.6228 g (5.2 mmol) of ODPA, 5.3761 g (47.1 mmol) of CHDA, 1.1004 g (5.2 mmol) of DCHM and 100 g of NMP were placed in a 200-mL four-necked flask and heated at 65° C. with stirring. After 6 hours, the contents were cooled to prepare a varnish.

Comparative Example 14

Under a stream of dry nitrogen, 12.7560 g (28.7 mmol) of 6FDA, 9.1952 g (28.7 mmol) of TFMB and 100 g of NMP were placed in a 200-mL four-necked flask and heated at 65° C. with stirring. After 6 hours, the contents were cooled to prepare a varnish.

The specifications of each composition for the varnishes synthesized in Examples 1 to 12 and Comparative Examples 1 to 13 are shown in Table 1. Moreover, the appearance of a polyimide resin film on the glass substrate obtained by the method of (2) using those varnishes is shown in Table 1. Additionally, using the varnishes of Examples 1 to 12 and Comparative Example 14, the transmittance of a polyimide resin film (10 μm in thickness) on the glass substrate obtained by the method of (3), the result obtained by measuring the CTE of a polyimide resin film obtained by the method of (1), the result of the chemical resistance test thereof, and the result of the heat resistance test on forming a gas barrier layer thereof are shown in Table 2.

TABLE 1

| | Acid dianhydride (mol %) | Diamine (mol %) | Appearance | | |
|---|---|---|---|---|---|
| | | | White turbidity | Cracking | Foaming |
| Example 1 | BPDA: 97.5 BSAA: 2.5 | CHDA: 100 | Absence | Absence | Absence |
| Example 2 | BPDA: 95 BSAA: 5 | | Absence | Absence | Absence |
| Example 3 | BPDA: 90 BSAA: 10 | | Absence | Absence | Absence |
| Example 4 | BPDA: 80 BSAA: 20 | | Absence | Absence | Absence |
| Example 5 | BPDA: 70 BSAA: 30 | | Absence | Absence | Absence |
| Example 6 | BPDA: 60 BSAA: 40 | | Absence | Absence | Absence |
| Example 7 | BPDA: 50 BSAA: 50 | | Absence | Absence | Absence |
| Example 8 | BPDA: 40 BSAA: 60 | | Absence | Absence | Absence |
| Example 9 | BPDA: 90 BSAA: 5 6FDA: 5 | | Absence | Absence | Absence |
| Example 10 | BPDA: 90 BSAA: 2.5 6FDA: 7.5 | | Absence | Absence | Absence |
| Example 11 | BPDA: 90 BSAA: 7.5 6FDA: 2.5 | | Absence | Absence | Absence |
| Example 12 | BPDA: 90 BSAA: 10 | CHDA: 90 4,4'-DOS: 10 | Absence | Absence | Absence |
| Comparative Example 1 | BPDA | CHDA: 100 | Presence | Absence | Absence |
| Comparative Example 2 | BPDA: 90 ODPA: 10 | | Presence | Absence | Absence |
| Comparative Example 3 | BPDA: 80 ODPA: 20 | | Presence | Absence | Absence |
| Comparative Example 4 | BPDA: 70 ODPA: 30 | | Presence | Absence | Absence |
| Comparative Example 5 | BPDA: 95 6FDA: 5 | | Presence | Absence | Absence |
| Comparative Example 6 | BPDA: 90 6FDA: 10 | | Absence | Presence | Presence |
| Comparative Example 7 | BPDA: 80 6FDA: 20 | | Absence | Presence | Presence |
| Comparative Example 8 | BPDA: 70 6FDA: 30 | | Absence | Presence | Presence |
| Comparative Example 9 | BPDA: 90 i-BPDA: 10 | | Presence | Presence | Absence |
| Comparative Example 10 | BPDA: 90 ODPA: 10 | CHDA: 90 3,3'-DDS: 10 | Presence | Absence | Absence |
| Comparative Example 11 | | CHDA: 90 4,4'-DDS: 10 | Presence | Absence | Absence |
| Comparative Example 12 | | CHDA: 90 TFMB: 10 | Presence | Absence | Absence |
| Comparative Example 13 | | CHDA: 90 DCHM: 10 | Presence | Absence | Absence |

TABLE 2

| | Acid dianhydride (mol %) | Diamine (mol %) | Optical characteristics Light transmittance % | Thermal characteristics CTE ppm/° C. | Chemical resistance (NMP) | Heat resistance |
|---|---|---|---|---|---|---|
| Example 1 | BPDA: 97.5 BSAA: 2.5 | CHDA: 100 | 90.2 | 14.5 | ○ | ○ |
| Example 2 | BPDA: 95 BSAA: 5 | | 88.9 | 17.3 | ○ | ○ |

TABLE 2-continued

| | Acid dianhydride (mol %) | Diamine (mol %) | Optical characteristics Light transmittance % | Thermal characteristics CTE ppm/° C. | Chemical resistance (NMP) | Heat resistance |
|---|---|---|---|---|---|---|
| Example 3 | BPDA: 90<br>BSAA: 10 | | 89.0 | 22.4 | ○ | ○ |
| Example 4 | BPDA: 80<br>BSAA: 20 | | 90.9 | 31.9 | ○ | ○ |
| Example 5 | BPDA: 70<br>BSAA: 30 | | 91.0 | 41.6 | ○ | ○ |
| Example 6 | BPDA: 60<br>BSAA: 40 | | 91.8 | 48.8 | ○ | Δ |
| Example 7 | BPDA: 50<br>BSAA: 50 | | 92.0 | 50.5 | ○ | Δ |
| Example 8 | BPDA: 40<br>BSAA: 60 | | 92.8 | 53.4 | ○ | Δ |
| Example 9 | BPDA: 90<br>BSAA: 5<br>6FDA: 5 | | 91.9 | 21.9 | ○ | ○ |
| Example 10 | BPDA: 90<br>BSAA: 2.5<br>6FDA: 7.5 | | 92.3 | 21.7 | ○ | ○ |
| Example 11 | BPDA: 90<br>BSAA: 7.5<br>6FDA: 2.5 | | 90.6 | 20.9 | ○ | ○ |
| Example 12 | BPDA: 90<br>BSAA: 10 | CHDA: 90<br>4,4'-DDS: 10 | 88.0 | 29.6 | ○ | ○ |
| Comparative Example 14 | 6FDA | TFMB | 93.7 | 53.2 | x | Δ |

Example 13

Figure 4:
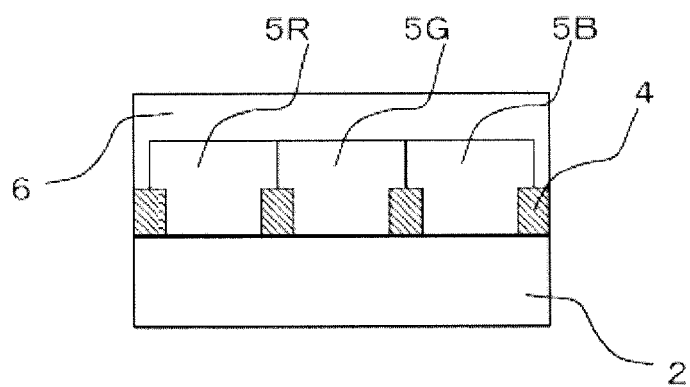
FIG. 4 is a cross-sectional view showing an example of a color filter with a polyimide substrate.

Preparation of Polyimide Substrate Color Filter (FIG. 4)

[1] Preparation of Polyimide Resin Film

On a glass substrate (AN100 (ASAHI GLASS CO., LTD.)) of 300 mm×400 mm×0.7 mm in thickness (not illustrated), a varnish synthesized in Example 2 was spin-coated so that the thickness after prebaking of 140° C.×20 minutes becomes 15±0.5 μm. Afterward, using a hot plate, a prebaking treatment of 140° C.×20 minutes was performed. Using an inert oven, under a stream of nitrogen (oxygen concentration of 20 ppm or lower), a coated film after the prebaking treatment was heated at a temperature increasing rate of 3.5° C./min to 300° C., held in place for 30 minutes, and cooled at a rate of 5° C./rain to 50° C. to prepare a polyimide resin film 2 (on the glass substrate).

[2] Preparation of Resin Black Matrix

On a polyimide resin film on the glass substrate prepared by the above-mentioned method, a black paste prepared in Preparation Example 3 was spin-coated and dried on a 130° C. hot plate for 10 minutes to form a black-colored resin coated film. A positive type photoresist ("SRC-100" available from Shipley Company L.L.C.) was spin-coated and prebaked on a 120° C. hot plate for 5 minutes. Next, using an ultra-high pressure mercury lamp, the photoresist was irradiated with ultraviolet rays of 100 mJ/cm² via a mask, after which, using a 2.38% aqueous tetramethylammonium hydroxide solution, developing of the photoresist and etching of the resin coated film were simultaneously performed to form a pattern. Furthermore, the resist was stripped off by methyl cellosolve acetate, after which the polyimide precursor was heated on a 280° C. hot plate for 10 minutes and imidized to form a black matrix 4. The thickness of the black matrix was measured, whereupon it was determined to be 1.4 μm.

[3] Preparation of Colored Layer

The rotation number of the spinner was adjusted so that, on a polyimide resin film, on which the black matrix was patterned, on the glass substrate, the thickness at a black matrix opening portion after a heat treatment becomes 2.0 μm, and a photosensitive red resist prepared in Preparation Example 4 was coated on a polyimide film. Next, the red resist was prebaked on a 100° C. hot plate for 10 minutes to obtain a red colored layer. Next, using an ultraviolet exposure apparatus "PLA-5011" available from Canon Inc., an exposure was performed with an exposure dose of 100 mJ/cm² (the ultraviolet intensity at 365 nm) via a chromium-made photomask through which light is transmitted so as to allow the black matrix opening portion and a partial region on the black matrix to be exposed in an island-like manner. After the exposure, developing was performed by immersing the layer in a developing solution composed of a 0.2 wt % aqueous tetramethylammonium hydroxide solution, and subsequently, the layer was washed with pure water. Afterward, the layer was subjected to a heating treatment in a 230° C. oven for 30 minutes to prepare a red pixel 5R.

Similarly, a green pixel 5G composed of a photosensitive green resist prepared in Preparation Example 5 and a blue pixel 5B composed of a photosensitive blue resist prepared in Preparation Example 6 were prepared. Subsequently, the rotation number of the spinner was adjusted so that the thickness at a colored layer portion after a heat treatment becomes 2.5 μm, and a resin composition prepared in Preparation Example 10 was coated. Afterward, the composition was subjected to a heating treatment in a 230° C. oven for 30 minutes to prepare an overcoat layer 6.

[4] Peeling Off Polyimide Substrate Color Filter from Glass Substrate

An incision was made at the peripheral part of a polyimide substrate color filter prepared on a glass substrate by the above-mentioned method, and by immersing the color filter in water for 12 hours, the polyimide substrate color filter was peeled off from the glass substrate. The pixel pattern shape was observed with an optical microscope, whereupon there was no change in the pattern shape between before and after peeling. Moreover, turbidity in the color filter was not observed, and with regard to the appearance, the color filter had favorably appearance as compared with a glass substrate color filter. Moreover, the CTE of the polyimide substrate color filter obtained was measured in accordance with the method of (6), whereupon it was determined to be 21 ppm/° C.

Example 14

Preparation of Polyimide Substrate Color Filter

A polyimide substrate color filter was prepared in the same manner as that in Example 13 except that a colored layer was prepared by the method described below using non-photosensitive coloring agent compositions described in Preparation Examples 7 to 9 for the preparation of the colored layer.

The rotation number of the spinner was adjusted so that, on a polyimide resin film 2, on which the black matrix 4 was patterned, on the glass substrate, the thickness at a black matrix opening portion after a heat treatment becomes 2.0 µm, and a non-photosensitive coloring agent composition prepared in Preparation Example 7 was coated on a polyimide film. Next, the composition was dried on a 130° C. hot plate for 10 minutes to form a red-colored resin coated film. On the red-colored resin coated film, a positive type photoresist ("SRC-100" available from Shipley Company L.L.C.) was spin-coated and prebaked on a 120° C. hot plate for 5 minutes. Next, using an ultra-high pressure mercury lamp, a mask exposure was performed by irradiating the photoresist with ultraviolet rays of 100 mJ/cm$^2$, after which, using a 2.38% aqueous tetramethylammonium hydroxide solution, developing of the photoresist and etching of the resin coated film were simultaneously performed to form a pattern. The resist was stripped off by methyl cellosolve acetate, and the polyimide precursor was heated on a 280° C. hot plate for 10 minutes and imidized to form a red pixel 5R.

Similarly, a green pixel 5G composed of a non-photosensitive green-colored coloring agent composition prepared in Preparation Example 8 and a blue pixel 5B composed of a non-photosensitive blue-colored coloring agent composition prepared in Preparation Example 9 were prepared. Subsequently, the rotation number of the spinner was adjusted so that the thickness at a colored layer portion after a heat treatment becomes 2.5 µm, and a resin composition prepared in Preparation Example 10 was coated. Afterward, the composition was subjected to a heating treatment in a 230° C. oven for 30 minutes to prepare an overcoat layer 6.

The pixel pattern shape of the polyimide substrate color filter obtained was observed with an optical microscope, whereupon there was no change in the pattern shape between before and after peeling. Moreover, turbidity in the color filter was not observed, and with regard to the appearance, the color filter had favorably appearance as compared with a glass substrate color filter. Moreover, the CTE of the polyimide substrate color filter obtained was measured in accordance with the method of (6), whereupon it was determined to be 20 ppm/° C.

Example 15

Figure 5:
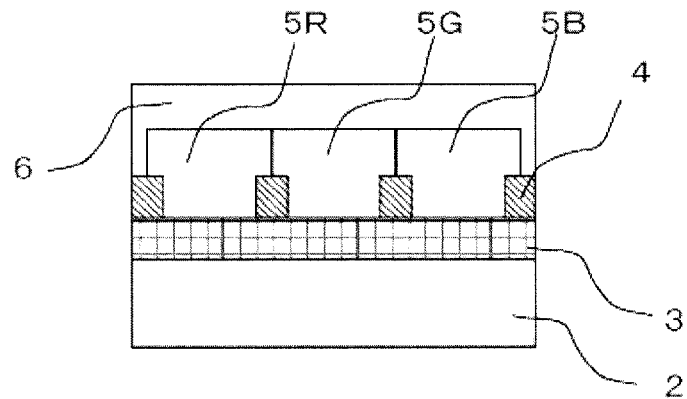
FIG. 5 is a cross-sectional view showing an example of a color filter with a polyimide substrate.

Preparation of Polyimide Substrate Color Filter
(FIG. 5)

A polyimide substrate color filter was prepared in the same manner as that in Example 14 except that using a target composed of silicon oxide, sputtering was performed under an argon atmosphere to form a gas barrier layer 3 composed of a silicon oxide film with a thickness of 300 nm on a polyimide resin film 2, and on the layered film, a resin black matrix 4, colored layers 5R, 5G and 5B, and an overcoat layer 6 were formed. The formation of the gas barrier layer was performed by sputtering under the conditions of a pressure of 2×10$^{-1}$ Pa, a substrate temperature of 300° C. and an AC power source of 13.56 MHz. The pixel pattern shape was observed with an optical microscope, whereupon there was no change in the pattern shape between before and after peeling. Moreover, turbidity in the color filter was not observed, and with regard to the appearance, the color filter had favorably appearance as compared with a glass substrate color filter. Moreover, the CTE of the polyimide substrate color filter obtained was measured in accordance with the method of (6), whereupon it was determined to be 18 ppm/° C.

Example 16

Figure 6:
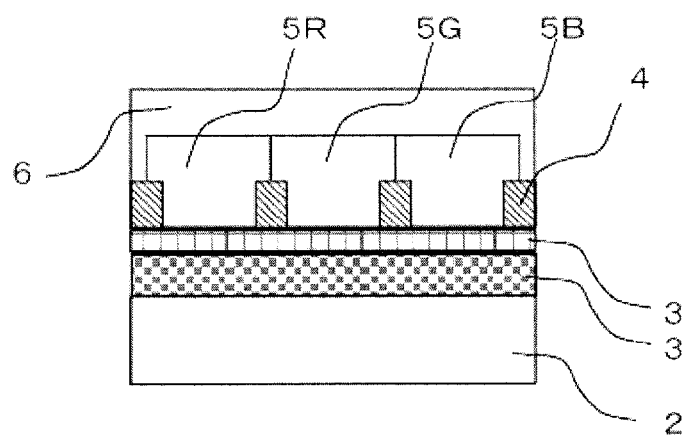
FIG. 6 is a cross-sectional view showing an example of a color filter with a polyimide substrate.

Preparation of Polyimide Substrate Color Filter
(FIG. 6)

A polyimide substrate color filter was prepared in the same manner as that in Example 14 except that using a mixed sintered target with a ratio of zinc oxide, silicon dioxide and aluminum oxide of 62/35/3 (mol), sputtering was performed under an argon atmosphere containing oxygen in 10 vol % content to form a gas barrier layer (lower layer) 3' composed of a film of silicon oxide/zinc oxide/aluminum oxide with a thickness of 200 nm on a polyimide resin film 2, and then, while maintaining the vacuum condition, using a target composed of silicon oxide, sputtering was performed under an argon atmosphere to obtain a gas barrier layer (upper layer) 3" composed of a silicon oxide film with a thickness of 100 nm, and on the layered film, a resin black matrix 4, colored layers 5R, 5G and 5B, and an overcoat layer 6 were formed. The formation of the gas barrier layer (lower layer) was performed by sputtering under the conditions of a pressure of 3×10$^{-1}$ Pa, a substrate temperature of 300 degrees and a DC power source of 3 kW. The formation of the gas barrier layer (upper layer) was performed by sputtering under the conditions of a pressure of 2×10$^{-1}$ Pa, a substrate temperature of 300° C. and an AC power source of 13.56 MHz. The pixel pattern shape was observed with an optical microscope, whereupon there was no change in the pattern shape between before and after peeling. Moreover, turbidity in the color filter was not observed, and with regard to the appearance, the color filter had favorably appearance as compared with a glass substrate color filter. Moreover, the CTE of the polyimide substrate color filter obtained was measured in accordance with the method of (6), whereupon it was determined to be 19 ppm/° C.

Example 17

Figure 7:
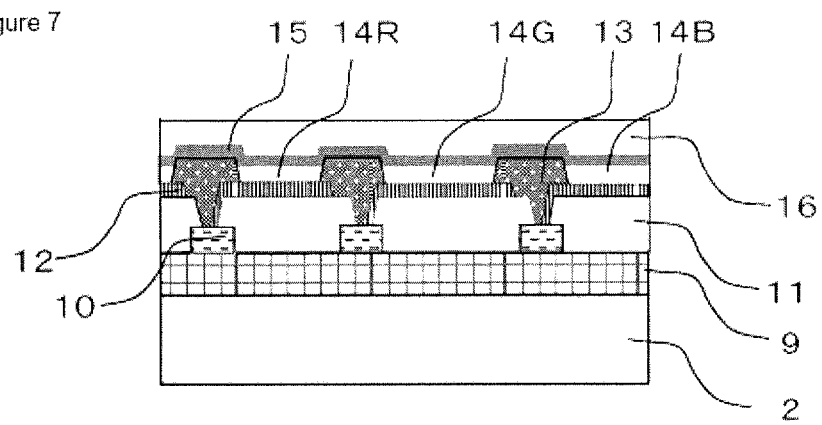
FIG. 7 is a cross-sectional view showing an example of an active matrix type organic EL element with a polyimide substrate.

Preparation of Polyimide Substrate Active Matrix
Type Organic EL Element (FIG. 7)

[1] Preparation of Polyimide Resin Film
On a glass substrate (AN100 (ASAHI GLASS CO., LTD.)) of 300 mm×400 mm×0.7 mm in thickness (not illustrated), avarnish prepared in Example 2 was spin-coated so that the thickness after prebaking of 140° C.×10 minutes becomes 15±0.5 µm. Afterward, using an air blowing dryer, a prebaking treatment of 140° C.×10 minutes was performed. A coated film after the prebaking treatment was directly placed in an inert oven previously heated to 350° C., held in place for 30 minutes under a stream of nitrogen (oxygen concentration of 20 ppm or lower), and cooled at a rate of 5° C./min to 50° C. to prepare a polyimide resin film 2 (on the glass substrate).

[2] Preparation of TFT Substrate

On a polyimide resin film (on the glass substrate) prepared by the above-mentioned method, using a plasma CVD method, an gas barrier film 9 composed of SiO was formed. Afterward, a bottom gate type TFT 10 was formed, and an insulation film (not illustrated) composed of $Si_3N_4$ was formed in a state of allowing the TFT to be covered therewith. Next, a contact hole was formed in this insulation film, after which a wiring line (1.0 μm in height, not illustrated) connected to the TFT through this contact hole was formed on the insulation film. This wiring line is intended for connecting two TFTs or connecting an organic EL element formed in a subsequent process to the TFT.

Furthermore, in order to flatten irregularities caused by the formation of the wiring line, a flattening layer 11 was formed on the insulation film in a state of allowing irregularities due to wiring to be filled therewith. The formation of the flattening layer was performed by spin-coating of a photosensitive polyimide varnish on a substrate, subjected to prebaking on a hot plate (120° C.×3 minutes), subjected to an exposure via a mask with a desired pattern and developing, and subjected to a heating treatment for 60 minutes at 230° C. under an air flow. The coating properties at the time of coating a varnish were satisfactory, and in the flattening layer obtained after subjected to the exposure, developing and the heating treatment, the generation of wrinkles and cracking was not observed. Furthermore, the average step-difference of wiring was determined to be 500 nm, and a square contact hole with a side of 5 μm was formed in the flattening layer prepared and the thickness was determined to be about 2 μm.

[3] Preparation of Bottom Emission Type Organic EL Element

A bottom emission type organic EL element was formed on the flattening layer 11 obtained. First, on the flattening layer, a first electrode 12 composed of ITO was formed so as to be connected to a wiring line (not illustrated) through a contact hole. Afterward, a resist was coated, subjected to prebaking, subjected to an exposure via a mask with a desired pattern, and subjected to developing. By utilizing this resist pattern as a mask, patterning of the first electrode was performed by wet etching using an ITO etchant. Afterward, the resist pattern was stripped off by a resist-stripper solution (a mixed liquid of monoethanolamine and diethylene glycol monobutyl ether). The substrate after stripping was washed with water and subjected to a thermal dehydration for 30 minutes at 200° C. to obtain an electrode substrate with a flattening layer. The dimensional change in thickness of the flattening layer after the thermal dehydration was determined to be less than 1% relative to that before the stripper solution processing. The first electrode thus obtained corresponds to an anode of an organic EL element.

Next, an insulation layer 13 with a shape of covering the end of the first electrode was formed. Similarly, a photosensitive polyimide varnish was used for the insulation layer. By disposing this insulation layer, it is possible to prevent a short circuit between the first electrode and a second electrode 15 formed in a subsequent process.

Furthermore, via a mask with a desired pattern in a vacuum vapor deposition apparatus, a hole transport layer, an organic light-emitting layer and an electron transport layer were sequentially deposited to dispose a red-color organic EL light-emitting layer 14R, a green-color organic EL light-emitting layer 14G and a blue-color organic EL light-emitting layer 14B. Then, on the whole upper face of the substrate, a second electrode 15 composed of Al/Mg (Al: reflection electrode) was formed. Furthermore, SiON sealing film 16 was formed by CVD film-forming. The substrate obtained was ejected from the vapor deposition apparatus and irradiated with an excimer laser (a wavelength of 308 nm) from the glass substrate side to peel off an organic EL element from the glass substrate. A voltage was applied to the active matrix type organic EL element obtained through a driving circuit, whereupon the element exhibited satisfactory light emission. Moreover, turbidity in the display part of the organic EL element obtained was not observed, and with regard to the appearance, the element had favorably appearance as compared with an organic EL element prepared with a glass substrate.

Example 18

Figure 8:
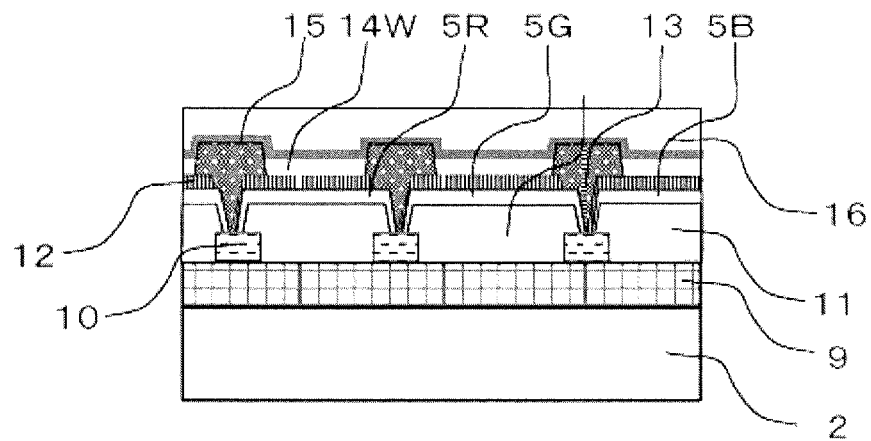
FIG. 8 is a cross-sectional view showing an example of an active matrix type organic EL element with a polyimide substrate.

Preparation of Polyimide Substrate Active Matrix Type Organic EL Element (FIG. 8)

[1] Preparation of Polyimide Resin Film

On a glass substrate (AN100 (ASAHI GLASS CO., LTD.)) of 300 mm×400 mm×0.7 mm in thickness, a varnish prepared in Example 2 was spin-coated so that the thickness after prebaking of 140° C.×10 minutes becomes 15±0.5 Afterward, using an air blowing dryer, a prebaking treatment of 140° C.×10 minutes was performed. A coated film after the prebaking treatment was directly placed in an inert oven previously heated to 350° C., held in place for 30 minutes under a stream of nitrogen (oxygen concentration of 20 ppm or lower), and cooled at a rate of 5° C./rain to 50° C. to prepare a polyimide resin film 2 (on the glass substrate).

[2] Preparation of TFT Substrate

On a polyimide resin film (on the glass substrate) prepared by the above-mentioned method, using a plasma CVD method, an gas barrier film 9 composed of SiO was formed. Afterward, a bottom gate type TFT 10 was formed, and an insulation film (not illustrated) composed of $Si_3N_4$ was formed in a state of allowing the TFT 10 to be covered therewith. Next, a contact hole was formed in this insulation film, after which a wiring line (1.0 μm in height, not illustrated) connected to the TFT through this contact hole was formed on the insulation film. This wiring line is intended for connecting two TFTs or connecting an organic EL element formed in a subsequent process to the TFT.

Furthermore, in order to flatten irregularities caused by the formation of the wiring line, a flattening layer 11 was formed on the insulation film in a state of allowing irregularities due to wiring to be filled therewith. The formation of the flattening layer was performed by spin-coating of a photosensitive polyimide varnish on a substrate, subjected to prebaking on a hot plate (120° C.×3 minutes), subjected to an exposure via a mask with a desired pattern and developing, and subjected to a heating treatment for 60 minutes at 230° C. under an air flow. The coating properties at the time of applying a varnish were satisfactory, and in the flattening layer obtained after subjected to the exposure, developing and the heating treatment, the generation of wrinkles and cracking was not observed. Furthermore, the average step-difference of wiring was determined to be 500 nm, and a square contact hole with a side of 5 µm was formed in the flattening layer prepared and the thickness was determined to be about 2 µm.

[3] Preparation of Color Filter Layer

The rotation number of the spinner was adjusted so that the thickness after a heat treatment becomes 1.9 and a non-photosensitive red-colored color paste PR-1 prepared in Preparation Example 7 was coated on the flattening layer 11 and heated on a 120° C. hot plate for 10 minutes to obtain a red colored layer. A positive type photoresist ("LC-100A" available from Rohm and Haas Electronic Materials, LLC) was coated with a slit coater so that the thickness after prebaking becomes 1.0 µm, and dried on a 100° C. hot plate for 5 minutes to perform prebaking. Using an ultraviolet exposure apparatus "PLA-501F" available from Canon Inc., a mask exposure was performed with an exposure dose of 100 mJ/cm$^2$ (the ultraviolet intensity at 365 nm) via a photomask. Next, using a 2.0% aqueous tetramethylammonium hydroxide solution, developing of the photoresist and etching of the resin coated film were simultaneously performed to form a pattern. Subsequently, the resist was stripped off by methyl cellosolve acetate. Next, curing was performed by subjecting the layer to a heat treatment in a 270° C. oven for 30 minutes to prepare a red pixel 5R with a thickness of 1.9 µm.

Similarly, a green pixel 5G and a blue pixel 5B were formed using a non-photosensitive green-colored color paste PG-1 prepared in Preparation Example 8 and a non-photosensitive blue-colored color paste PB-1 prepared in Preparation Example 9, respectively.

[3] Preparation of Overcoat Layer

On a color filter layer formed on the substrate, a photosensitive positive type transparent resist prepared in Preparation Example 12 was spin-coated at an arbitrary rotation number using a spin coater (1H-360S available from MIKASA CO., LTD.), and then, subjected to prebaking for 2 minutes at 90° C. using a hot plate (SCW-636 available from DAINIPPON SCREEN MFG. CO., LTD.) to prepare a film with a thickness of 3 µm. Using a parallel light mask aligner (hereinafter, abbreviated as PLA) (PLA-501F available from Canon Inc.) equipped with an ultra-high pressure mercury lamp, the film prepared was subjected to a pattern exposure via a gray scale mask for measuring the sensitivity, after which using an automatic developing apparatus (AD-2000 available from Takizawa Industries Co., Ltd.), the film was subjected to shower development for 60 seconds with ELM-D (trade name, available from MITSUBISHI GAS CHEMICAL COMPANY, INC.), which is an aqueous 2.38% by weight tetramethylammonium hydroxide solution, and then, rinsed with water for 30 seconds. Afterward, using a PLA (PLA-501F available from Canon Inc.), over the whole face of the film, an exposure as a bleaching exposure was performed with an exposure dose of 3000 J/m$^2$ (in terms of the exposure quantity at a wavelength of 365 nm) using an ultra-high pressure mercury lamp.

Afterward, the film was subjected to soft baking for 2 minutes at 110° C. using a hot plate, and then, subjected to cured for 1 hour at 230° C. in the air using an oven (IHPS-222 available from Tabai ESPEC Corp.) to prepare an overcoat layer (not illustrated).

[4] Preparation of Bottom Emission Type Organic EL Element

A bottom emission type organic EL element was formed on the overcoat layer obtained. First, on the overcoat layer, a first electrode 12 composed of ITO was formed so as to be connected to a wiring line (not illustrated) through a contact hole. Afterward, a resist was coated, subjected to prebaking, subjected to an exposure via a mask with a desired pattern, and subjected to developing. By utilizing this resist pattern as a mask, patterning of the first electrode 12 was performed by wet etching using an ITO etchant. Afterward, the resist pattern was stripped off by a resist-stripper solution (a mixed liquid of monoethanolamine and diethylene glycol monobutyl ether). The substrate after stripping was washed with water and subjected to a thermal dehydration for 30 minutes at 200° C. to obtain an electrode substrate with a color filter layer. The dimensional change in thickness of the color filter layer after the thermal dehydration was determined to be less than 1% relative to that before the stripper solution processing. The first electrode thus obtained corresponds to an anode of an organic EL element.

Next, an insulation layer 13 with a shape of covering the end of the first electrode 12 was formed. Similarly, a photosensitive polyimide varnish was used for the insulation layer 13. By disposing this insulation layer 13, it is possible to prevent a short circuit between the first electrode and a second electrode 15 formed in a subsequent process.

Furthermore, via a mask with a desired pattern in a vacuum vapor deposition apparatus, a hole transport layer, an organic light-emitting layer and an electron transport layer were sequentially deposited to dispose a white-color organic EL light-emitting layer 14W. Then, on the whole upper face of the substrate, a second electrode 15 composed of Al/Mg (Al: reflection electrode) was formed. Furthermore, SiON sealing film 16 was formed by CVD film-forming. The substrate obtained was ejected from the vapor deposition apparatus and irradiated with an excimer laser (a wavelength of 308 nm) from the glass substrate side to peel off an organic EL element from the glass substrate. A voltage was applied to the active matrix type organic EL element obtained through a driving circuit, whereupon the element exhibited satisfactory light emission. Moreover, turbidity in the display part of the organic EL element obtained was not observed, and with regard to the appearance, the element had favorably appearance as compared with an organic EL element prepared with a glass substrate.

Example 19

Figure 9:
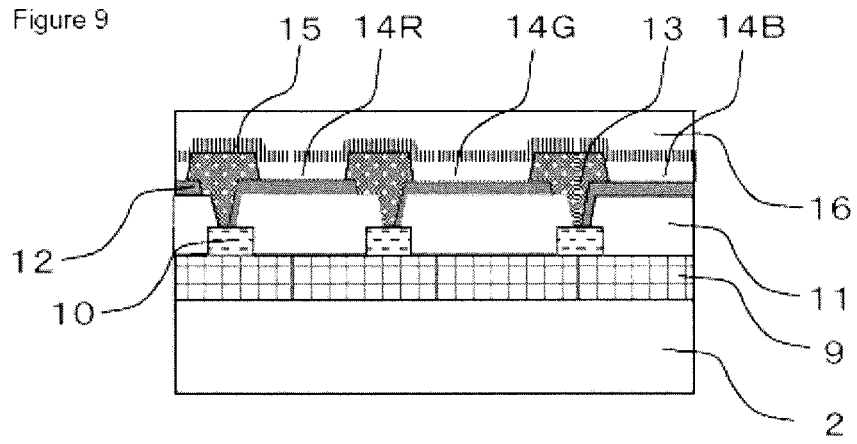
FIG. 9 is a cross-sectional view showing an example of an active matrix type organic EL element with a polyimide substrate.

Preparation of Polyimide Substrate Active Matrix Type Organic EL Element (FIG. 9)

[1] Preparation of Polyimide Resin Film

On a glass substrate (AN100 (ASAHI GLASS CO., LTD.)) of 300 mm×400 mm×0.7 mm in thickness, a varnish prepared in Example 2 was spin-coated so that the thickness after prebaking of 140° C.×10 minutes becomes 15±0.5 µm. Afterward, using an air blowing dryer, a prebaking treatment of 140° C.×10 minutes was performed. A coated film after the prebaking treatment was directly placed in an inert oven previously heated to 350° C., held in place for 30 minutes under a stream of nitrogen (oxygen concentration of 20 ppm or lower), and cooled at a rate of 5° C./min to 50° C. to prepare a polyimide resin film 2 (on the glass substrate).

[2] Preparation of TFT Substrate

On a polyimide resin film 2 (on the glass substrate) prepared by the above-mentioned method, using a plasma CVD method, an gas barrier film 9 composed of SiO was formed. Afterward, a bottom gate type TFT 10 was formed, and an insulation film (not illustrated) composed of $Si_3N_4$ was formed in a state of allowing the TFT to be covered therewith. Next, a contact hole was formed in this insulation film, after which a wiring line (1.0 µm in height, not illustrated) connected to the TFT through this contact hole was formed on the insulation film. This wiring line is intended for connecting two TFTs or connecting an organic EL element formed in a subsequent process to the TFT.

Furthermore, in order to flatten irregularities caused by the formation of the wiring line, a flattening layer 11 was formed on the insulation film in a state of allowing irregularities due to wiring to be filled therewith. The formation of the flattening layer was performed by spin-coating of a photosensitive polyimide varnish on a substrate, subjected to prebaking on a hot plate (120° C.×3 minutes), subjected to an exposure via a mask with a desired pattern and developing, and subjected to a heating treatment for 60 minutes at 230° C. under an air flow. The coating properties at the time of applying a varnish were satisfactory, and in the flattening layer obtained after subjected to the exposure, developing and the heating treatment, the generation of wrinkles and cracking was not observed. Furthermore, the average step-difference of wiring was determined to be 500 nm, and a square contact hole with a side of 5 μm was formed in the flattening layer prepared and the thickness was determined to be about 2 μm.

[3] Preparation of Top Emission Type Organic EL Element

Atop emission type organic EL element was formed on the flattening layer 11 of the polyimide substrate TFT obtained by the above-mentioned method. First, on the flattening layer 11, a first electrode 12 composed of Al/ITO (Al: reflection electrode) was formed so as to be connected to a wiring line through a contact hole. Afterward, a resist was coated, subjected to prebaking, subjected to an exposure via a mask with a desired pattern, and subjected to developing. By utilizing this resist pattern as a mask, patterning of the first electrode was performed by wet etching using an ITO etchant. Afterward, the resist pattern was stripped off by a resist-stripper solution (a mixed liquid of monoethanolamine and diethylene glycol monobutyl ether). The substrate after stripping was washed with water and subjected to a thermal dehydration for 30 minutes at 200° C. to obtain an electrode substrate with a flattening layer. The change in thickness of the flattening layer after the thermal dehydration was determined to be less than 1% relative to that before the peeling liquid processing. The first electrode 12 thus obtained corresponds to an anode of an organic EL element.

Next, an insulation layer 13 with a shape of covering the end of the first electrode 12 was formed. Similarly, a photosensitive polyimide varnish was used for the insulation layer. By disposing this insulation layer, it is possible to prevent a short circuit between the first electrode 12 and a second electrode 15 formed in a subsequent process.

Furthermore, via a mask with a desired pattern in a vacuum vapor deposition apparatus, a hole transport layer, an organic light-emitting layer and an electron transport layer were sequentially deposited to dispose a red-color organic EL light-emitting layer 14R, a green-color organic EL light-emitting layer 14G and a blue-color organic EL light-emitting layer 14B. Then, on the whole upper face of the substrate, a second electrode 15 composed of Mg/ITO was formed. Furthermore, SiON sealing film 16 was formed by CVD film-forming. The substrate obtained was ejected from the vapor deposition apparatus and irradiated with an excimer laser (a wavelength of 308 nm) from the glass substrate side to peel off an organic EL element from the glass substrate. A voltage was applied to the active matrix type organic EL element obtained through a driving circuit, whereupon the element exhibited satisfactory light emission. Moreover, turbidity in the display part of the organic EL element obtained was not observed, and with regard to the appearance, the element had favorably appearance as compared with an organic EL element prepared with a glass substrate.

Example 20

Preparation of Polyimide Substrate Active Matrix Type Organic EL Panel (FIG. 3)

[1] Preparation of Polyimide Substrate Color Filter with Glass Substrate

A polyimide substrate color filter was prepared on a glass substrate by the method described in Example 14.

[2] Preparation of Polyimide Substrate TFT with Glass Substrate

A polyimide resin film 8, a gas barrier layer 9, a TFT 10 and a flattening layer 11 were sequentially prepared by the method described in Example 17 except that a polyimide precursor varnish prepared in Preparation Example 1 was used.

[3] Preparation of Top Emission Type Organic EL Element

A top emission type organic EL element was formed on the flattening layer 11 of the polyimide substrate TFT obtained by the above-mentioned method. First, on the flattening layer 11, a first electrode 12 composed of Al/ITO (Al: reflection electrode) was formed so as to be connected to a wiring line through a contact hole. Afterward, a resist was coated, subjected to prebaking, subjected to an exposure via a mask with a desired pattern, and subjected to developing. By utilizing this resist pattern as a mask, patterning of the first electrode 12 was performed by wet etching using an ITO etchant. Afterward, the resist pattern was stripped off by a resist-stripper solution (a mixed liquid of monoethanolamine and diethylene glycol monobutyl ether). The substrate after stripping was washed with water and subjected to a thermal dehydration for 30 minutes at 200° C. to obtain an electrode substrate with a flattening layer. The change in thickness of the flattening layer after the thermal dehydration was determined to be less than 1% relative to that before the stripper solution processing. The first electrode 12 thus obtained corresponds to an anode of an organic EL element.

Next, an insulation layer 13 with a shape of covering the end of the first electrode 12 was formed. Similarly, a photosensitive polyimide varnish was used for the insulation layer. By disposing this insulation layer, it is possible to prevent a short circuit between the first electrode and a second electrode 15 formed in a subsequent process.

Furthermore, via a mask with a desired pattern in a vacuum vapor deposition apparatus, a hole transport layer, an organic light-emitting layer and an electron transport layer were sequentially deposited to dispose a white-color organic EL light-emitting layer 14W. Then, on the whole upper face of the substrate, a second electrode 15 composed of Mg/ITO was formed. Furthermore, SiON sealing film 16 was formed by CVD film-forming.

[4] Preparation of Organic EL Panel

A polyimide substrate color filter with a glass substrate obtained in the above-mentioned [1] and a top emission type organic EL element with a glass substrate obtained in [3] were bonded together with a glue layer 17 interposed therebetween. Subsequently, by excimer laser irradiation (a wavelength of 308 nm) from the glass substrate side, the polyimide substrate color filter and the organic EL element were peeled off from their glass substrates to prepare an organic EL panel. A voltage was applied to the active matrix type organic EL panel obtained through a driving circuit, whereupon the panel exhibited satisfactory light emission.

Moreover, turbidity in the display part of the organic EL element obtained was not observed, and with regard to the appearance, the element had favorably appearance as compared with an organic EL element prepared with a glass substrate.

REFERENCE SIGNS LIST

1 Glass substrate
2 Polyimide film
3 Gas barrier layer
3' Gas barrier layer (lower layer)
3" Gas barrier layer (upper layer)
4 Black matrix
5R Red pixel
5G Green pixel
5B Blue pixel
6 Overcoat layer
7 Glass substrate
8 Polyimide resin film
9 Gas barrier layer
10 TFT layer
11 Flattening layer
12 First electrode
13 Insulation layer
14W White-color organic EL light-emitting layer
14R Red-color organic EL light-emitting layer
14G Green-color organic EL light-emitting layer
14B Blue-color organic EL light-emitting layer
15 Second electrode
16 Sealing film
17 Glue layer
20 Flexible CF
30 Flexible organic EL array

The invention claimed is:

1. A polyimide precursor having a unit structure expressed by a general formula (1) and a unit structure expressed by a general formula (2):

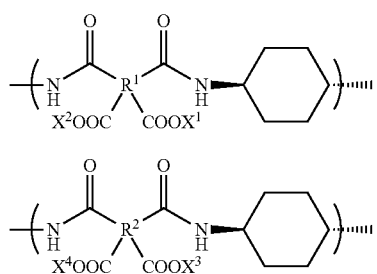

(1)

(2)

wherein, in the general formulas (1) and (2), $X^1$ to $X^4$ each independently represent a hydrogen atom, a monovalent organic group with 1 to 10 carbon atoms or a monovalent alkylsilyl group with 1 to 10 carbon atoms, $R^1$ is represented by a general formula (3) and $R^2$ is represented by a general formula (4):

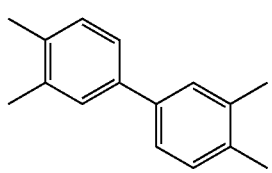

(3)

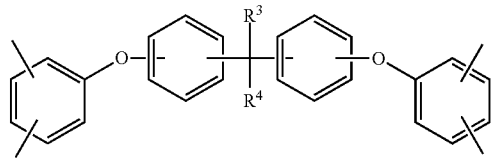

(4)

wherein, in the general formula (4), $R^3$ and $R^4$ each independently represent a monovalent organic group with 1 to 10 carbon atoms.

2. The polyimide precursor according to claim 1, wherein a ratio of the unit structure expressed by a general formula (1) to the unit structure expressed by a general formula (2) [the number of moles of the unit structure expressed by a general formula (1)/the number of moles of the unit structure expressed by a general formula (2)] is 70/30 to 99.5/0.5.

3. A polyimide prepared from a polyimide precursor according to claim 1.

4. A flexible substrate comprising a resin film containing a polyimide according to claim 3.

5. A flexible substrate comprising an inorganic film disposed on a resin film containing a polyimide according to claim 3.

6. A color filter comprising a black matrix and a colored pixel disposed on a resin film containing a polyimide according to claim 3.

7. The color filter according to claim 6, wherein a resin used for at least one layer of the black matrix and a colored pixel layer contains a polyimide resin.

8. The color filter according to claim 6, wherein the black matrix is composed of a low optical density layer and a high optical density layer formed on the low optical density layer, and a resin used for at least one layer of the low optical density layer and the high optical density layer contains a polyimide resin.

9. The color filter according to claim 6, further comprising an inorganic film.

10. A production method of a color filter, comprising a black matrix and a colored pixel disposed on a resin film containing a polymide prepared from a polymide precursor according to claim 1 comprising the following steps of:
   (1) applying a resin composition containing a polyimide precursor according to claim 1 and a solvent on a support substrate;
   (2) removing the solvent from the coated resin composition;
   (3) obtaining a polyimide-containing resin film by imidizing the polyimide precursor in the resin composition;
   (4) forming a black matrix and a colored pixel on the polyimide-containing resin film; and
   (5) peeling off the polyimide-containing resin film from the support substrate.

11. The production method of a color filter according to claim 10, further comprising the step of forming an inorganic film.

12. A flexible display device prepared by bonding a light-emitting element to a color filter according to claim 6.

13. A flexible display device equipped with a light-emitting element disposed on a flexible substrate according to claim 4.

14. The flexible display device according to claim 12, wherein the light-emitting element is an organic EL element.

* * * * *